(12) United States Patent
Iguchi

(10) Patent No.: US 10,978,616 B2
(45) Date of Patent: Apr. 13, 2021

(54) MICRO LIGHT EMITTING ELEMENT AND IMAGE DISPLAY DEVICE

(71) Applicant: SHARP KABUSHIKI KAISHA, Sakai (JP)

(72) Inventor: Katsuji Iguchi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/257,007

(22) Filed: Jan. 24, 2019

(65) Prior Publication Data

US 2019/0229235 A1   Jul. 25, 2019

(30) Foreign Application Priority Data

Jan. 24, 2018   (JP) .............................. JP2018-009878

(51) Int. Cl.
  *H01L 33/24*   (2010.01)
  *H01L 33/32*   (2010.01)
  (Continued)

(52) U.S. Cl.
  CPC ............ *H01L 33/24* (2013.01); *H01L 27/156* (2013.01); *H01L 33/20* (2013.01); *H01L 33/32* (2013.01); *H01L 33/38* (2013.01); *H01L 33/62* (2013.01); *H01L 33/0093* (2020.05); *H01L 33/44* (2013.01); *H01L 33/46* (2013.01)

(58) Field of Classification Search
  CPC ... H01L 33/007; H01L 33/0075; H01L 33/24; H01L 33/20; H01L 33/36; H01L 33/38; H01L 33/382; H01L 33/38562; H01L 33/30; H01L 33/32; H01L 33/44; H01L 33/46; H01L 33/0079; H01L 2933/0016; H01L 2933/0066; H01L 2933/0083; H01L 27/15; H01L 27/156; H01L 33/08; H01L 33/105; H01L 33/18; H01L 33/11; H01L 33/14; H01L 33/504; H01L 33/50; H01L 33/60; H01L 33/62; H01L 33/686; H01L 33/387; H01L 33/06; H01L 33/0025; H01L 33/405; H01L 33/486; H01L 33/562; H01L 33/0008; H01L 33/0016; H01L 33/385;
  (Continued)

(56) References Cited

U.S. PATENT DOCUMENTS 7,598,149 B2 * 10/2009 Dawson ................ H01L 27/156
                                                    257/E21.377
10,205,055 B2 * 2/2019 Chu ..................... H01L 25/0753
(Continued)

FOREIGN PATENT DOCUMENTS

CN           101132047 A           2/2008

*Primary Examiner* — Natalia A Gondarenko
(74) *Attorney, Agent, or Firm* — ScienBiziP, P.C.

(57) ABSTRACT

[Object] To provide a micro LED element that can reduce deterioration in light emission efficiency, even when the micro LED element is miniaturized in size.
[Solution] A micro LED element (100) includes: a nitride semiconductor layer (14) including an N-side layer (11), a light emission layer (12), and a P-side layer (13); and a plurality of micro-mesas each having a slope that surrounds the light emission layer (12) and is inclined at an angle within a prescribed range including 45° as an angle (θ) formed by the slope and the light emission layer, and a flat portion formed by a surface of the P-side layer.

19 Claims, 11 Drawing Sheets

(51) Int. Cl.
  *H01L 33/38*   (2010.01)
  *H01L 33/62*   (2010.01)
  *H01L 27/15*   (2006.01)
  *H01L 33/20*   (2010.01)
  *H01L 33/46*   (2010.01)
  *H01L 33/44*   (2010.01)
  *H01L 33/00*   (2010.01)

(58) Field of Classification Search
  CPC ..... H01L 27/1214; H01L 33/52; H01L 33/54; H01L 33/58; H01L 33/0093; G09F 9/33
  USPC ....... 257/79, 88, 89, 98, 100, 102, 117, 118, 257/77, 76, 103
  See application file for complete search history.

(56) References Cited

U.S. PATENT DOCUMENTS

| | | | |
|---|---|---|---|
| 2002/0017652 A1 | 2/2002 | Illek et al. | |
| 2003/0141496 A1 | 7/2003 | Illek et al. | |
| 2004/0084682 A1 | 5/2004 | Illek et al. | |
| 2006/0071225 A1* | 4/2006 | Beeson | H01L 33/0093 257/98 |
| 2006/0145164 A1 | 7/2006 | Illek et al. | |
| 2006/0180820 A1 | 8/2006 | Illek et al. | |
| 2006/0231852 A1* | 10/2006 | Kususe | H01L 33/385 257/99 |
| 2009/0179211 A1* | 7/2009 | Yoo | H01L 33/20 257/98 |
| 2012/0194103 A1* | 8/2012 | Odnoblyudov | H01L 33/382 315/363 |
| 2015/0362165 A1 | 12/2015 | Chu et al. | |
| 2018/0240950 A1* | 8/2018 | Jang | H01L 33/46 |
| 2018/0323343 A1* | 11/2018 | Jang | H01L 33/38 |
| 2019/0386189 A1* | 12/2019 | Lee | H01L 27/15 |

* cited by examiner

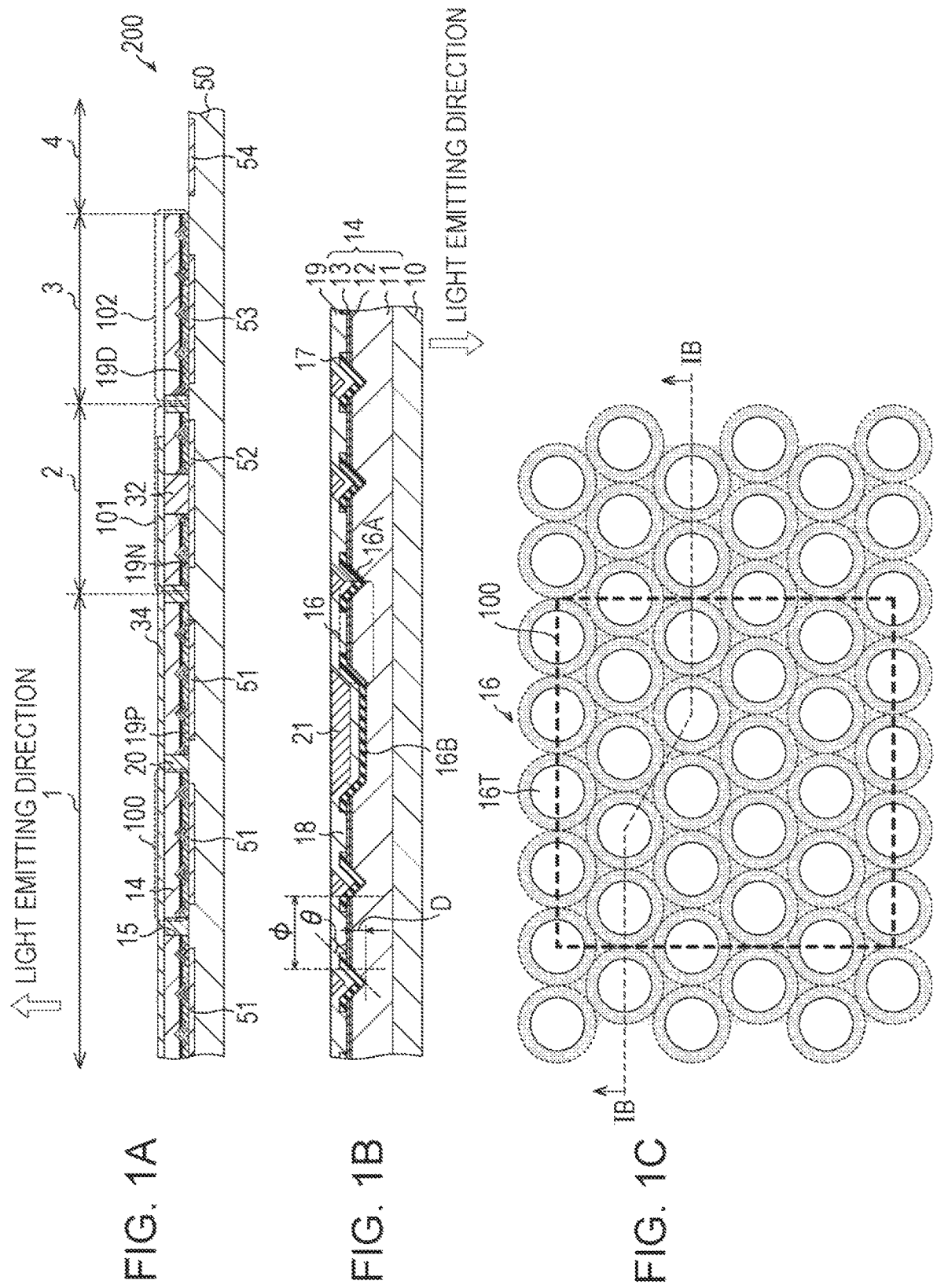

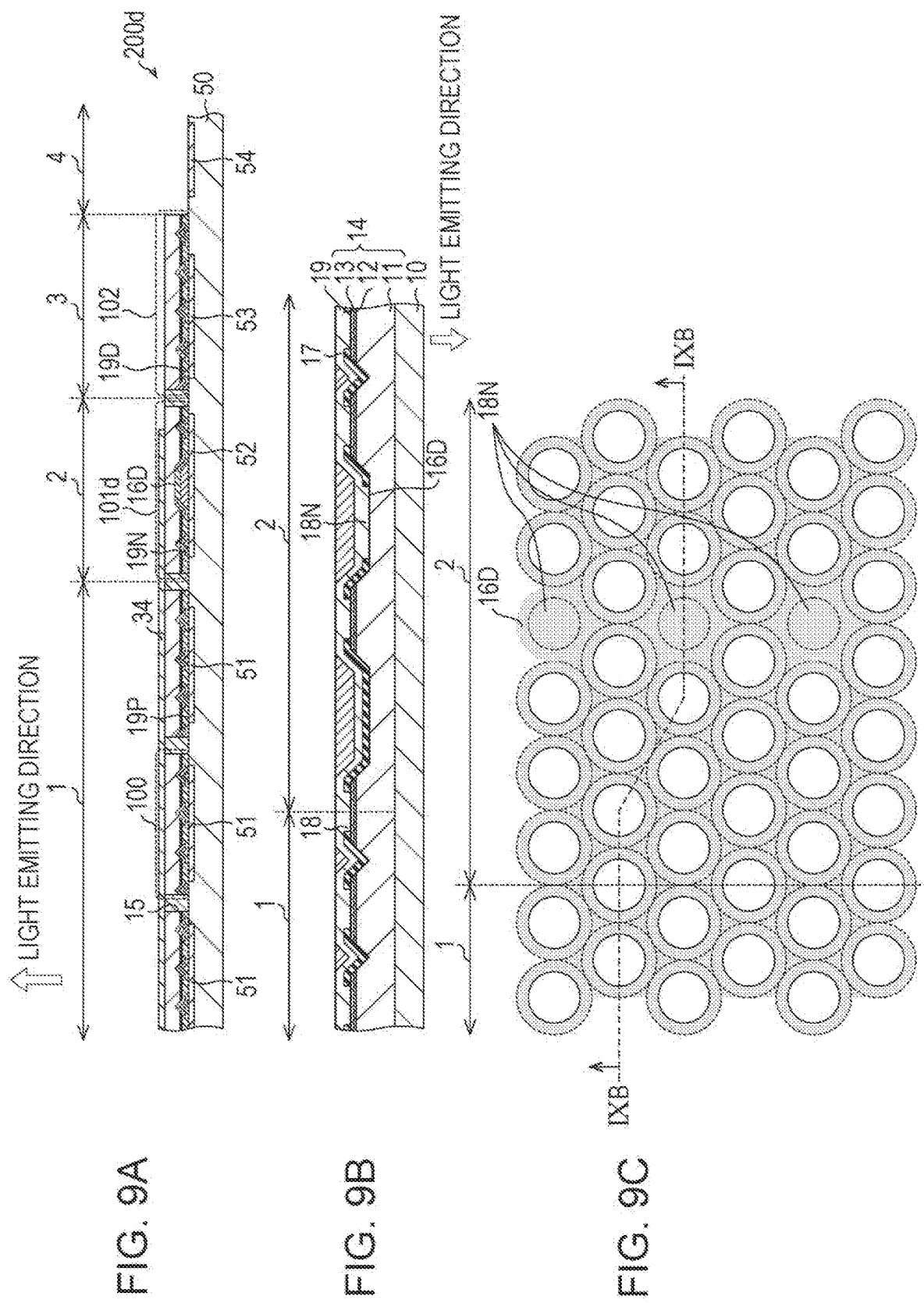

MICRO LIGHT EMITTING ELEMENT AND IMAGE DISPLAY DEVICE

BACKGROUND

1. Field

The present disclosure relates to a micro light emitting element, an image display device including a plurality of micro light emitting elements, and a method of manufacturing the image display device.

2. Description of the Related Art

In the field of flat panel displays, regardless of display sizes, that is, whether displays are large-size displays or medium- and small-size displays, liquid crystal display devices and organic electro-luminescence (EL) displays have been used as display devices. Further, as flat panel displays, there have been proposed LED displays employing light emitting elements made of compound semiconductors as display devices (see Japanese Unexamined Patent Application Publication No. 2009-272591 (published on Nov. 19, 2009) and Japanese Unexamined Patent Application Publication (Translation of PCT Application) No. 2016-503958 (published on Feb. 8, 2016)).

The light emitting elements as described above are called "micro light emitting element". Currently, micro light emitting elements have been miniaturized, and micro light emitting elements having a size of about 7 μm have been published, for example (see Francois Olivier, Anis Daami, Ludovic Dupre, Franck Henry, Bernard Aventurier, Francois Templier, "Investigation and Improvement of 10 μm Pixel-pitch GaN-based Micro-LED Arrays with Very High Brightness", SID 2017 DIGEST, P 353, 2017).

Like general LEDs, micro light emitting elements are often mounted on a driving circuit substrate through a layer formation on a growth substrate and singulation thereafter (pick and place method). In a research and development stage, there has been proposed a manufacturing method in which after an epilayer, which corresponds to LEDs, is grown on a growth substrate, the epilayer is bonded to a driving circuit substrate at a wafer level so that individual LEDs are formed on the driving circuit substrate (see Francois Templier, Lamine Benaïssa, Bernard Aventurier, Christine Di Nardo, Matthew Charles, Anis Daamd, Franck Henry, Ludovic Dupré, "A Novel Process for Fabricating High-Resolution and Very Small Pixel-pitch GaN LED Microdisplays", SID 2017 DIGEST, P 268, 2017).

When, however, the above-mentioned micro light emitting elements, which are described in Japanese Unexamined Patent Application. Publication. No. 2009-272591, Japanese Unexamined Patent Application Publication (Translation of PCT Application) No. 2016-503958, "Investigation and improvement of 10 μm Pixel-pitch GaN-based Micro-LED Arrays with Very High Brightness", and "A Novel Process for Fabricating High-Resolution and Very Small Pixel-pitch GaN LED Microdisplays", are miniaturized in size, there arises a problem that the light emission efficiency drops.

The present disclosure has been made in view of the above-mentioned problem and is aimed at providing a micro light emitting element, an image display device, and a method of manufacturing an image display device that can achieve high light emission efficiency, even when the micro light emitting element is miniaturized in size.

SUMMARY

In order to deal with the above-mentioned problem, according to an aspect of the present disclosure, there is provided a micro light emitting element including: a nitride semiconductor layer including an N-side layer, a light emission layer, and a P-side layer laminated in this order from a side of a light emission surface; a first electrode placed on a side of the P-side layer; a second electrode placed on a side of the N-side layer; and a plurality of micro-mesas formed in a surface on the side of the P-side layer of the nitride semiconductor layer. Each of the plurality of micro-mesas has a flat top surface of the P-side layer and surrounds the light emission layer by a slope, the slope being a surface extended from the P-side layer to a part of the N-side layer and being inclined at an angle within a prescribed range including 45° with respect to the light emission layer.

In order to deal with the above-mentioned problem, according to an aspect of the present disclosure, there is provided a method of manufacturing an image d splay device including: laminating, on a growth substrate, an N-side layer, a light emission layer, and a P-side layer in this order to obtain a nitride semiconductor layer; etching the P-side layer, the light emission layer, and a part of the N-side layer of the nitride semiconductor layer to form a slope, thereby forming a micro-mesa having a flat top surface formed by the P-side layer, and the slope; providing a first electrode on the P-side layer; bonding the nitride semiconductors layer to the driving circuit substrate; removing the growth substrate; etching the nitride semiconductor layer on the driving circuit substrate, thereby dividing the nitride semiconductor layer for each micro light emitting element; and forming a second electrode on a surface opposite to the driving circuit substrate of the nitride semiconductor layer. The formation of the micro-mesa is performed before the bonding.

According to one aspect of the present disclosure, there can be provided the micro light emitting element, the image display device, and the method of manufacturing an image display device that can achieve high light emission efficiency, even when the micro light emitting element is miniaturized in size.

BRIEF DESCRIPTION OF THE DRAWINGS

FIG. 1A is a sectional view of an image display device including a plurality of micro light emitting elements according to a first embodiment of the present disclosure, FIG. 1B is an enlarged sectional view of the P-side layer-side surface of the micro light emitting element, and FIG. 1C is a plan view of the micro light emitting element when viewed from the P-side layer-side surface;

FIG. 9A is a sectional view of an image display device including a plurality of micro light emitting elements according to a fourth embodiment of the present disclosure, FIG. 9B is an enlarged sectional view of the P-side layer-side surface of the micro light emitting element, and FIG. 9C is a plan view of the micro light emitting element when viewed from the P-side layer-side surface;

Figure 2A:
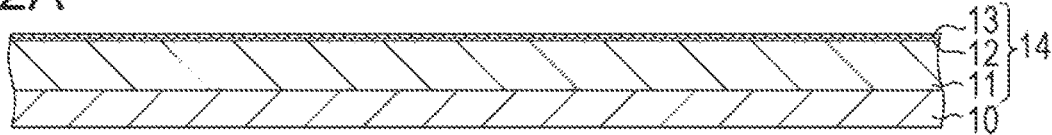
FIG. 2A to FIG. 2F are sectional views of steps of a forming process of a micro-mesa in a manufacturing process of the micro light emitting element illustrated in FIG. 1A to FIG. 1C.

DESCRIPTION OF THE EMBODIMENTS (Configuration Example of Related-Art Display Device and Problem Thereof)

Prior to the detailed description of an embodiment of the disclosure of the present application, a configuration example of a related-art display device and a problem thereof are summarized below.

Hitherto, in liquid crystal display devices, which have been widely used as display devices, the brightness of each pixel is adjusted by a liquid crystal element turning on or off backlight.

Liquid crystal displays have a difficulty in increasing contrast. This is because it is difficult for the liquid crystal display device to completely cut the backlight.

Further, the liquid crystal displays have a difficulty in increasing color rendering properties. This is because it is difficult for a plurality of color filters, which are used for expressing primary colors (for example, the three colors of RGB), to completely cut light of wavelength other than the transmission bands of the color filters, and as a result, the transmission bands of the color filters are difficult to completely separate from each other.

Meanwhile, organic EL displays employing organic EL elements as display devices have been put into practical use. The organic EL elements are self-light emitting elements and are monochromatic light emitting elements of R, G, and B. The organic EL displays have therefore been expected to deal with the above-mentioned problems of the liquid crystal displays, chat is, the problems of contrast and color rendering properties, and have actually been put into practical use in the field of small-size flat panel displays for smartphones.

The organic EL displays, however, have a problem that the brightness of the organic EL elements tends to be deteriorated over time. This is because the light emission layer of the organic EL element is made of organic material. Thus, the organic EL displays are employed in smartphones having relatively short product lives (in other words, short replacement cycles), but it is difficult to employ the organic EL displays in products (for example, televisions) having long product lives (in other words, long replacement cycles). Further, when the organic EL displays are employed in the products having the long product lives, complex circuits have to be used to compensate for a deterioration in brightness over time.

As a flat panel display that deals with the problems of the liquid crystal displays and the organic EL displays described above, there has been proposed an LED display employing a light emitting element made of compound semiconductors as a display device. The MED display, in which the light emitting elements made of the compound semiconductors are arranged in a two-dimensional array, has a high contrast and is excellent in color rendering properties and resistant to a deterioration in brightness over time.

In particular, as compared to the organic EL element, the light emitting element has high light emission efficiency and high long-term reliability (small effects of a deterioration in brightness over time and other matters). The LED display can thus be a high brightness display that provides high visibility outside. In the field of super large-size flat panel displays, LED displays for digital signage have recently been put into practical use. Further, also in the field of medium- and small-size flat panel displays and large-size flat panel displays, such as wearable terminals and TVs, the development of LED displays has been advanced.

The related-art micro light emitting element, however, has the following problem.

When micro light emitting elements are miniaturized, the external quantum efficiency (the ratio of the number of emitted photons to the number of injected electrons) of the micro light emitting elements is reduced to a very small value. Specifically, when the size of the micro light emitting element falls below 10 μm, the external quantum efficiency thereof falls below 11%. In contrast to this, the external quantum efficiency of a light emitting element having a general size (for example, 100 μm or more and 1000 μm or less) is about 30% to 60%. In this way, the external quantum efficiency of a micro light emitting element having a size falling below 10 μm is obviously low as compared to that of a light emitting element having a general size. An image display device including a micro light emitting element is expected to have high light emission efficiency. Thus, the low external quantum efficiency of the micro light emitting element is a quite serious problem.

First Embodiment

Now, an image display device 200 including a plurality of micro light emitting elements 100 according to a first embodiment of the present disclosure is described with reference to FIG. 1A to FIG. 3H.

A wavelength conversion layer, a light diffusion layer, a color filter, a microlens, or other members that may be arranged on the light emission side are not illustrated in FIG. 1A to FIG. 3H because such members do not directly relate to the present disclosure. A driving circuit substrate 50 is generally a silicon substrate (semiconductor substrate) on which an LSI is formed. The driving circuit substrate 50 can be manufactured by a well-known technology, and hence the function and the configuration thereof are not described in detail. The micro light emitting element may have various planar shapes such as a rectangle, a polygon, a circle, and an ellipse, but it is assumed that the micro light emitting element has the largest length of 60 μm or less. It is assumed that the image display device 200 includes 3000 or more micro light emitting elements integrated in a pixel region 1. In the following, a case where the micro light emitting element 100 is a nitride semiconductor configured to emit light in a wavelength band from ultraviolet light to green is only described. The micro light emitting element 100 can, however, be replaced by an AlInGaP-based element configured to emit light in a wavelength band from yellowish green to red, or an AlGaAs-based or GaAs-based element configured to emit light in a wavelength band from red to infrared light.

In the following, with regard to a nitride semiconductor layer 14 that constructs the micro light emitting element 100, a configuration in which an N-side layer 11 is placed on the light emission side is only described. However, a configuration in which a P-side layer 13 is placed on the light emission side is also possible. The N-side layer 11, a light emission layer 12, and the P-side layer 13 are generally not single layers but include a plurality of layers to achieve optimum layers. Such matters, however, do not directly relate to the configuration of the present disclosure, and hence the detailed structure of each layer is not described. A light emission layer is generally sandwiched between an N-type layer and a P-type layer. The N-type layer or the P-type layer may, however, include a non-doped layer or a layer having a dopant with opposite conductivity in some cases, and hence the layers sandwiching the light emission layer 12 therebetween are referred to as "N-side layer" and "P-side layer" in the following description.

FIG. 1A is a sectional view of the image display device 200 including the plurality of micro light emitting elements 100. In the surface of the micro light emitting element 100 of the present disclosure, a plurality of micro-mesa structures are formed to improve light extraction efficiency. FIG. 1B is an enlarged sectional view of the micro light emitting element 100, illustrating the micro-mesa structure. FIG. 1C is a schematic plan view illustrating the surface structure of the micro-mesa structure. As illustrated in FIG. 1A to FIG. 1C, the image display device 200 includes the plurality of micro light emitting elements 100 and the driving circuit substrate 50 having formed thereon a pixel driving circuit configured to supply drive current to the plurality of micro light emitting elements 100, and the plurality of micro light emitting elements 100 are laminated on the driving circuit substrate 50 in a two-dimensional array.

FIG. 2A to FIG. 2F are views illustrating a manufacturing process of the micro-mesa structure in a manufacturing process of the micro light emitting element 100. FIG. 3A to FIG. 3H are views illustrating a manufacturing process of the micro light emitting element 100 and the image display device 200.

(Structure of Micro Light Emitting Element 100)

As illustrated in FIG. 1A, the image display device 200 has the pixel region 1, a common interconnection region 2, a dummy region 3, and a peripheral region 4. In the pixel region 1, the micro light emitting elements 100, which construct each pixel, are aligned. The micro light emitting element 100 includes a nitride semiconductor layer 14, a P-electrode 19P (first electrode), and a common. N-electrode 34 (second electrode). The common N-electrode 34 is placed on the light emission surface side, and the P-electrode 19P is placed on the driving circuit substrate 50 side. On the P-electrode 19P side of the nitride semiconductor layer 14, the micro-mesa structure is formed. It means that the micro-mesa structure should be formed on the opposite surface to the light emission surface in the common interconnection region 2, there is provided a connection element 101 including the nitride semiconductor layer 14, an N-electrode 19N (first electrode), and the common N-electrode 34 (second electrode) like the micro light emitting element 100. The connection element 101 does not emit light, and hence may not have the micro-mesa. Also in the dummy region 3, there is provided a dummy element 102 including the nitride semiconductor layer 14, a dummy P-electrode 19D (first electrode), and the common N-electrode (second electrode). The dummy element 102 does not emit light, and hence may not have the micro-mesa. Alternatively, as illustrated in FIG. 1A, the common N-electrode 34 may not be provided. The P-electrode 19P is connected to a P-drive electrode 51 on the driving circuit substrate 50. The common N-electrode 34 is connected to an N-drive electrode 52 on the driving circuit substrate 50 through a plug 32 in the common interconnection region 2. The micro light emitting elements 100 are supplied with current from the corresponding P-drive electrodes 51 to emit light. The light is emitted from the common N-electrode 34 side, which is opposite to the drying circuit substrate 50 side.

The peripheral region 4 is an edge portion of the image display device 200, and has a scribe region for separating the image display devices 200 into individuals, and a connection portion for connection with an external circuit, such as a wire bonding pad. In the peripheral region 4, the nitride semiconductor layer 14 is removed. The dummy region 3 is a region other than the pixel region 1, the common interconnection region 2, and the peripheral region 4 of the image display device 200. In this region, although no light is emitted, the nitride semiconductor layer 14 is placed to achieve the flat surface. In the pixel region 1 of the driving circuit substrate 50, the pixel driving circuit for each pixel is placed. Predominantly in the dummy region 3, a row selection circuit, a column signal output circuit, an image processing circuit, an input-output circuit, and other components are arranged on the driving circuit substrate 50. A dummy electrode 53 is placed on the driving circuit substrate 50 to fix the nitride semiconductor layer 14 and keep light from entering these circuits.

The micro light emitting elements 100 are individually divided by pixel isolation trenches 15, and the pixel isolation trench 15 is filled with a filling material 20. This structure is crucial in avoiding light crosstalk phenomena, that is, light created by one micro light emitting element 100 is emitted from neighboring micro light emitting elements 100. When neighboring micro light emitting elements 100 are connected by nitride semiconductor layer, light crosstalk phenomena are enhanced by light leakage through the connected portion.

Next, micro-mesas 16 that are formed in one of the surfaces of the micro light emitting element 100 are described with reference to FIG. 1B and FIG. 1C. FIG. 1C is a plan view of a surface opposite to the light emission surface, and FIG. 1B is a sectional view of an IB-IB portion in FIG. 1C. As illustrated in FIG. 1B, the nitride semiconductor layer 14 includes, in order from the light emission surface side, the N-side layer 11, the light emission layer 12, and the P-side layer 13, and has, on the P-side layer 13 side, a surface processed into the plurality of micro-mesas 16. As illustrated in FIG. 1C, in the present embodiment, the micro-mesa 16 has a truncated cone shape having a circular flat top surface 16T on the P-side layer 13 side, and a slope 16 having the P-side layer 13, the light emission layer 12, and a part of the N-side layer 11. Thus, in the micro light emitting element. 100 of the present disclosure, the light emission layer 12 is surrounded by the slope 16A to be divided into a plurality of regions separated from each other. Further, as illustrated in FIG. 1B, in each of the micro-mesas 16, the entire periphery of the light emission layer 12 is surrounded by the slope 16A. In this way, the micro-mesa 16 is a mesa structure smaller than the micro light emitting element 100, has a mesa structure in which the plurality of micro-mesas 16 are included in the micro light emitting element 100. The micro-mesa 16 has a size of 10 μm or less.

The surfaces of the micro-mesas 16 are covered with a protective film 17, and a P-side contact hole 18 is opened in the flat top surface 16T. Further, a P-electrode layer 19 is formed. The surface of the P-electrode layer 19 may be covered with a flattening protective film 21 to be flattened.

The micro-mesas 16 are formed on the light emission layer 12 side of the micro light emitting element 100 to improve the light extraction efficiency. First, it is assumed that the micro light emitting element 100 does not have the micro-mesa and is a cuboid. A micro light emitting element is generally formed through dry etching of the flat nitride semiconductor layer 14, and hence has side walls substantially vertical to the nitride semiconductor layer 14. Thus, when the micro-mesa is not formed, the micro light emitting element is a cuboid. Although light is isotropically emitted from the light emission layer 12, light emitted at a critical angle $\alpha$ or less (hereinafter referred to as "vertical light") is only emitted from the cuboidal light emitting element, where the angle is defined between the light emission direction and a line perpendicular to the emission surface (the surface of the N-side layer 11 in this case). Light emitted at an angle close to a direction parallel to the light emission layer 12 is emitted to the outside from side surfaces of the micro light emitting element, but is absorbed by the filling material 20 or neighboring micro light emitting elements. Such light is thus not effective light for display. Light other than the above light is iteratively reflected inside the cuboid through total internal reflection, and is not emitted to the outside. When light is emitted from a GaN layer (refractive index: 2.5) to a resin layer having a refractive index of 1.5, $\alpha$ is about 37°. Even when light emitted toward the P-side layer and reflected by the surface of the P-side layer 13 to be emitted from the N-layer side is included on the assumption that such light has no reflection loss, only about 20% of total light $(2*(1-\cos 37°)*2\pi/(4\pi))$ can be extracted. Even when the common N-electrode 34 is present on the N-side layer 11, if the resin layer is present on the outer side of the common N-electrode 34, the same problem arises. When the outside atmosphere is an air atmosphere, the critical angle is smaller.

The ratio of light emitted at an angle within ±β with respect to the light emission layer 12 (hereinafter referred to as "horizontal light") to the total light emission amount of the light emission layer 12 is about $\sin \beta \ (2*\cos(90°-\beta)*2\pi/(4\pi)$. When $\beta=37°$ is satisfied, the percentage is about 60%, which is large. When the light emission layer 12 is surrounded by the side surfaces vertical to the light emission layer 12, it is difficult to extract the horizontal light to the outside of the nitride semiconductor layer 14 from the emission surface as described above. Meanwhile, when the light emission layer 12 is surrounded by the slope 16A, the direction of the horizontal light is changed so that the horizontal light can be extracted to the outside from the emission surface. The extraction efficiency can thus be greatly improved.

When an angle where the slope 16A intersects with a surface formed by the light emission layer 12 is denoted by θ, the angle θ is desirably an angle within a prescribed range including 45°. When θ=45° is satisfied, horizontal light with β≤α can be emitted to the outside from the emission surface, and the extraction efficiency is highest. Thus, θ=45° is most desirable, but the extraction efficiency is greatly improved also when the angle θ is from 30° to 60°.

As described above, the micro light emitting element 100 includes: the nitride semiconductor layer 14 including the N-side layer 11, the light emission layer 12, and the P-side layer 13 laminated in this order from the side of the light emission surface; the first electrode 19P placed on the side of the P-side layer 13; the second electrode 34 placed on the side of the N-side layer 11; and the plurality of micro-mesas 16 formed in the surface on the side of the P-side layer 13 of the nitride semiconductor layer 14. Each of the plurality of micro-mesas 16 has the flat top surface 16T of the P-side layer 13 and surrounds the light emission layer 12 by the slope 16A. The slope 16A is a surface extended from the P-side layer 13 to a part of the N-side layer 11, and is inclined at an angle within the prescribed range including 45° with respect to the light emission layer 12.

As described later, the slope 16A is formed by partly etching the nitride semiconductor layer 14 (see FIG. 2B). The angle θ in an actually manufactured micro light emitting element 100 depends on the etching precision, and fluctuates in a certain range. When dry etching is employed as the etching method, the fluctuation range of the angle θ, which depends on the etching precision, about ±10°. This means that the angle θ in an actually manufactured micro light emitting element 100 is not limited to 45°, which is the prescribed angle, and may be a prescribed angle around 45°, that is, an angle in a range of 45°±10°. The fluctuation range of the angle θ described above may change depending on an etching method that is employed in an etching step described later.

A vertical distance from the light emission layer 12 to the bottom portion of the slope 16A is denoted by D. Then, as D becomes larger, the extraction efficiency becomes higher. The diameter of a portion in which the light emission layer 12 intersects with the slope 16A is denoted by ϕ. Then, the light extraction efficiency is highest when D=sin β/(cos β−sin β)·ϕ is satisfied. This is because, when this condition is satisfied, horizontal light emitted from the light emission layer 12 can be totally extracted. When β=37° is satisfied, D=3.06·ϕ is satisfied, and the upper limit of D is about three times as large as the diameter of the light emission layer 12 in a plan view. Meanwhile, when D is increased, as compared to a case where θ=90° is satisfied, the area of the light emission layer 12 is reduced to $\{\phi/(\phi+2\cdot D)\}^2$, and the density of current flowing through the light emission layer 12 is increased, with the result that the internal quantum efficiency drops due to the droop effect. An actual value of D is accordingly determined to an optimum value with the trade-off of an improvement in extraction efficiency and the droop effect due to a reduction in area of the light emission layer.

Next, the reason why the plurality of small micro-mesas 16 are provided to one micro light emitting element 100 is described. In order to improve the light extraction efficiency, a slope can be formed only on the periphery of the micro light emitting element 100, but this configuration has the following two problems. First, as described above, in order to increase the extraction efficiency as much as possible, the value of D has to be large as compared to the diameter ϕ of the remaining light emission layer 12. The value of D, however, has an upper limit that is the thickness of the N-side layer 11, and hence when the size of the micro light emitting element 100 is large, it is difficult to sufficiently increase the light extraction efficiency. When the micro-mesas 16 are formed, the light extraction efficiency can be improved with the slope 16A with a relatively small D.

Secondly, when a slope is provided on the periphery of the micro light emitting element 100, at a stage at which the slope has been formed, the contour of the micro light emitting element 100 is determined, and hence the micro light emitting element 100 has to be precisely aligned with the P-drive electrode 51 at a stage at which the nitride semiconductor layer 14 is bonded to the driving circuit substrate 50. Meanwhile, such alignment may not be performed when the large number of micro-mesas 16 are formed in the surface of the nitride semiconductor layer 14, and after the nitride semiconductor layer 14 is bonded, the resultant is processed to obtain the micro light emitting elements 100. The micro-mesas 16 are formed in the surface of the nitride semiconductor layer 14 in advance, and hence the driving circuit substrate 50 and the nitride semiconductor layer 14 can be bonded to each other through wafer-wafer bonding without precise alignment, with the result that the productivity can be greatly enhanced. In addition, all the steps of the image display device 200 can be executed in the wafer process (semiconductor wafer process), which means that dust can be reduced and the yield can be improved as compared to a case where pieces of the nitride semiconductor layer, which are obtained through division, are mounted on the driving circuit substrate by a die bonding apparatus (chip assembly process). Consequently, the cost of the image display device 200 can be greatly reduced.

(Method of Manufacturing Micro Light Emitting Element 100)

Next, an example of a manufacturing method that is applied to manufacturing of the micro light emitting element 100 is described with reference to FIG. 2A to FIG. 3H.

As illustrated in FIG. 2A, the N-side layer 11, the light emission layer 12, and the P-side layer 13 are laminated on a growth substrate 10 in this order to form the nitride semiconductor layer 14 (step 1). As the growth substrate 10, for example, a (111) surface silicon substrate can be used. In particular, the growth substrate 10 desirably has the same size as the driving circuit substrate 50. The growth substrate 10 may be sapphire ($Al_2O_3$) or SiC, for example. Further, as a material of the nitride semiconductor layer 14, a GaN-based semiconductor can be used, for example. Further, as an apparatus configured to grow the nitride semiconductor layer 14 on the growth substrate 10, an MOCVD apparatus can be used, for example. The growth substrate 10 may have a surface with a textured structure. The N-side layer 11 desirably does not include a high resistivity layer because the N-side layer 11 has to allow current to flow therethrough in its thickness direction, and is desirably a good N-type conductor having high conductivity in the layer thickness direction. Further, at a stage at which the nitride semiconductor layer 14 has been formed on the growth substrate 10 and the resultant has been returned to room temperature, the growth substrate 10 desirably has small warp. An 8-inch wafer desirably has a warp of 35 μm or less. Such a reduction in warp can be achieved by providing an appropriate buffer layer in the N-side layer 11.

The light emission layer 12 includes a multiple-quantum well layer including an InGaN layer and a GaN layer. The N-side layer 11 and the P-side layer 13 each include a multilayer structure with various layers. The light emission layer 12 may be a nitride semiconductor layer doped with a rare-earth element such as europium. (Eu), erbium (Er), or thulium (Tm). In the present embodiment, the specific configurations of the N-side layer 11, the light emission layer 12, and the P-side layer 13 are not particularly limited, and the configurations of an N-side layer, a light emission layer, and a P-side layer employed in a related-art light emitting element can be appropriately employed, for example. In the present embodiment, the description of the specific configurations of the N-side layer 11, the light emission layer 12, and the P-side layer 13 is accordingly omitted.

A thickness $t_n$ of the N-side layer 11 is generally 10 μm or less, and is about 5 μm±2 μm in many cases. A thickness $t_{mqw}$ of the light emission layer 12 is generally 10 nm or more and 600 nm or less, and is about 50 nm or more and 100 nm or less in many cases. A thickness $t_p$ of the P-side layer 13 is generally 50 nm or more and 1000 nm or less, and is about 100 nm or more and 300 nm or less in many cases.

Figure 2B:
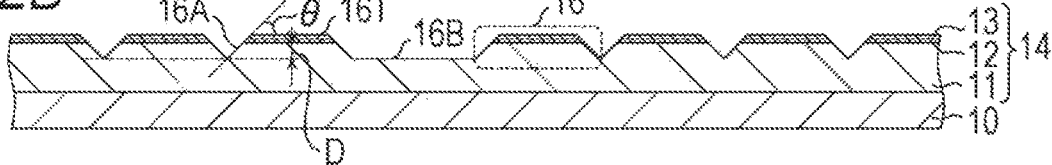

As illustrated in FIG. 2B, the micro-mesas 16 are formed by partly etching the nitride semiconductor layer 14 (step 2). The micro-mesa 16 is formed so that the angle θ, where the slope 16A of the micro-mesa 16 intersects with the surface formed by the light emission layer 12, is 45°, that is, an angle within the prescribed range. To form the micro-mesa 16, first, a resist pattern covering the micro-mesa flat top surface 16T is formed with the use of general photolithography. After that, the P-side layer 13, the light emission layer 12, and a part of the N-side layer 11 are etched with the use of a dry etching apparatus.

Figure 2C:
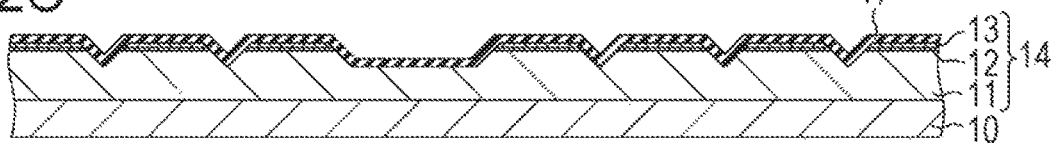

Then, as illustrated in FIG. 2C, the protective film 17 is laminated. The protective film 17 covers the slope 16A. The protective film 17 is formed by CVD with $SiO_2$ (silicon dioxide), for example. Specifically, the protective film 17 is desirably a transparent insulating film such as a $SiO_2$ film. The transparent insulating film may be a SiON film, a SiN film, a SiOCN film, or a silicone resin film, for example, other than the $SiO_2$ film. In order to maintain the insulation and increase the light reflectance, the thickness of the protective film 17 is desirably 75 nm or more, and more desirably 400 nm or more.

Figure 2D:
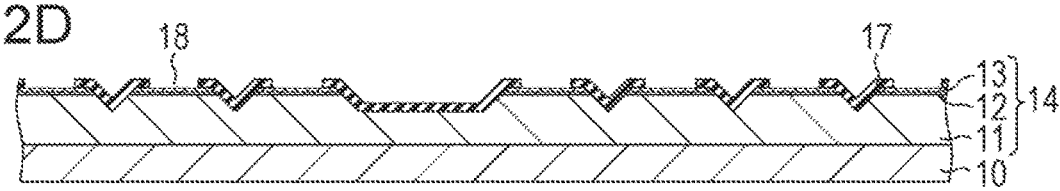

In addition, as illustrated in FIG. 2D, the protective film 17 on the micro-mesa flat top surface 16T is removed to form the P-side contact hole 18. The P-side contact hole 18 can be formed with the use of photolithography and wet or dry etching, which are generally used.

Figure 2E:
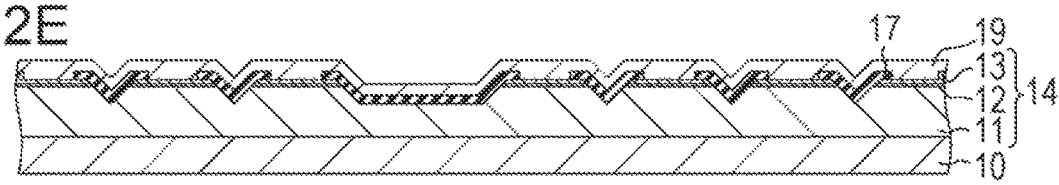

As illustrated in FIG. 2E, the P-electrode layer 19 is formed over the entire surface. As described later, the P-electrode layer 19 in the pixel region 1 corresponds to the P-electrode 19P that is connected to the P-side layer 13 of the micro light emitting element 100 (see also FIG. 3C referred to later) (step 3). At this stage, the P-electrode layer 19 is formed over the entire surface of the wafer, which is the growth substrate 10, and is not patterned. A film that is appropriate as the P-electrode layer 19 is a metal multilayer film including, on the P-side layer side, a metal thin film, for example, a thin film of a metal such as aluminum or silver, which is in contact with the nitride semiconductor layer 14 and has high interfacial reflectance, and on the surface side, gold or copper suitable for connection with the P-drive electrode 51 on the driving circuit substrate 50. The P-electrode layer 19 may be a laminated film including a transparent conductive film and a metal film, such as ITO (indium tin oxide). Such a multilayer film can be formed with the use of electron beam deposition or sputtering, for example.

As illustrated in FIG. 2E, also on the slope 16A, the protective film 17 is covered with the P-electrode layer 19. In this way, the protective film 17, which is the transparent insulating film, is covered with the metal having high reflectance on the slope 16A to increase the reflectance of the slope 16A, which leads to an effect of enhancement in light extraction efficiency. Further, there is an effect that leakage of light to neighboring pixels can be avoided. In addition, in this configuration, the P-electrode layer 19 also covers the micro-mesa flat top surface 16T, and hence light reflectance in the flat top surface 16T is increased, with the result that the light extraction efficiency can be enhanced and light can be kept from leaking on the driving circuit substrate 50 side. In this way, the P-electrode (first electrode) has a role of enhancing the light extraction efficiency and keeping light from leaking to the neighbors, while serving as one electrode of the micro light emitting element 100. Excellent display performance can therefore be achieved by the simple manufacturing method.

Figure 2F:
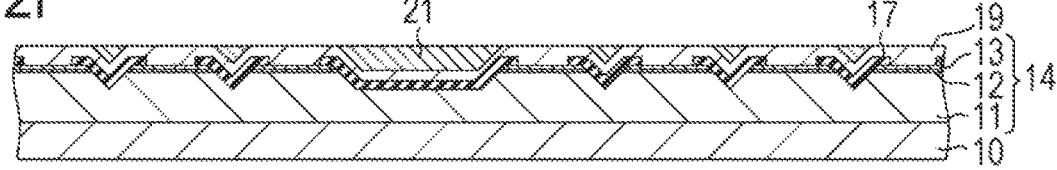

As illustrated in FIG. 2F, the flattening protective film 21 is formed. The flattening protective film 21 is a protective film for filling recesses, such as the micro-mesa slope 16A and the bottom portion 16B, to flatten the surface. The flattening protective film 21 can be formed as follows, for example: a protective film made of SiO$_2$ (silicon dioxide) or the like is laminated on the P-electrode layer 19, the surface is flattened by CMP, and then the resultant is processed so that the P-electrode layer 19 on the micro-mesa flat top surface 16T is exposed. The flattening protective film 21 can be omitted.

Through the steps described above, the micro-mesas 16 are formed over the entire surface of the nitride semiconductor layer 14 formed on the growth substrate 10.

Subsequently, the manufacturing process of the micro light emitting element 100 and the image display device 200 is described with reference to FIG. 3A to FIG. 3H.

On the driving circuit substrate 50, a driver circuit of the image display device 200 is formed. The driver circuit includes a pixel driving circuit configured to drive each of the micro light emitting elements 100, a row selection circuit configured to select a specific row of the pixels arranged in a two-dimensional array, a column signal output circuit configured to output a light emission intensity signal to a specific column of the pixels, an image processing circuit, and other components. On the surface of the driving circuit substrate 50, the P-drive electrode 51 configured to supply current to each of the micro light emitting elements 100 is exposed in the pixel region 1, the N-drive electrode 52 is exposed in the common interconnection region 2, the dummy electrode 53 is exposed in the dummy region 3, and the external connection electrode 54 is exposed in the peripheral region 4. FIG. 3A to FIG. 3H are schematic sectional views illustrating one image display device 200, but the steps are actually performed on a substrate having the plurality of image display devices 200 arranged thereon. The driving circuit substrate 50 is, for example, an 8-inch silicon substrate, and has several hundred driver circuits of the image display devices 200 arranged thereon.

Figure 3A:
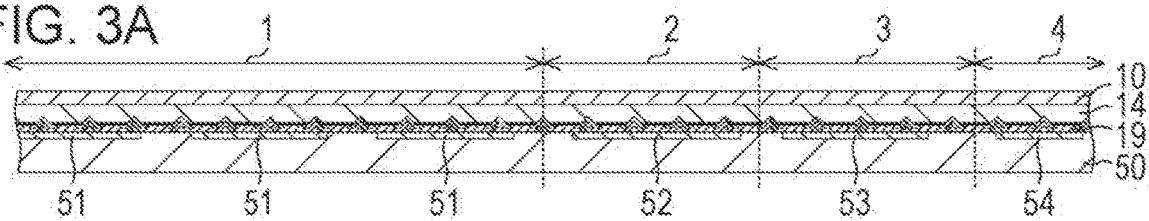
FIG. 3A to FIG. 3H are sectional views of the micro light emitting element and the image display device in steps of a method of manufacturing the image display device illustrated in FIG. 1A to FIG. 1C.

First, as illustrated in FIG. 3A, the nitride semiconductor layer 14 formed through the process in FIG. 2A to FIG. 2F is bonded on the driving circuit substrate 50 (step 4). On the surface of the nitride semiconductor layer 14, the P-electrode layer 19 is exposed to be connected to the P-drive electrode 51, the N-drive electrode 52, the dummy electrode 53, and the external connection electrode 54 on the driving circuit substrate 50. In bonding, the metal electrodes (for example, copper) may be directly connected to each other or may be connected to each other through metal nanoparticles serving as an adhesive layer. In this step, bonding is performed without precise alignment. In bonding wafers to each other, it is enough that the wafers are overlapped with each other. In order to avoid stress due to expansion and contraction caused by heating and cooling in bonding, the materials of the growth substrate 10 and the driving circuit substrate 50 are desirably the same, and are particularly desirably silicon.

Figure 3B:
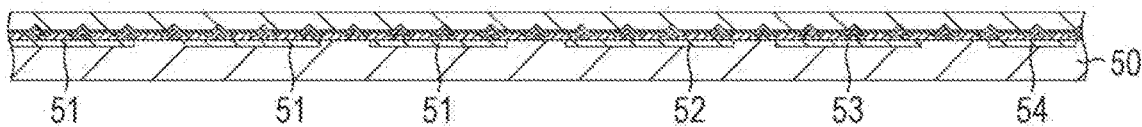

Next, in the step in FIG. 3B, the growth substrate 10 is removed (step 5). When a silicon substrate is used, the growth substrate 10 can be removed by a combination of grinding, polishing, plasma etching, wet etching, and other methods. In the process illustrated in FIG. 3A to FIG. 3H, the nitride semiconductor layer 14 is bound to the driving circuit substrate 50 while the growth substrate 10 is attached. The nitride semiconductor layer 14 may, however, be bonded to the driving circuit substrate 50 after the nitride semiconductor layer 14 is once transferred onto another substrate (transfer substrate) and the growth substrate is removed, and then the transfer substrate may be peeled.

Figure 3C:
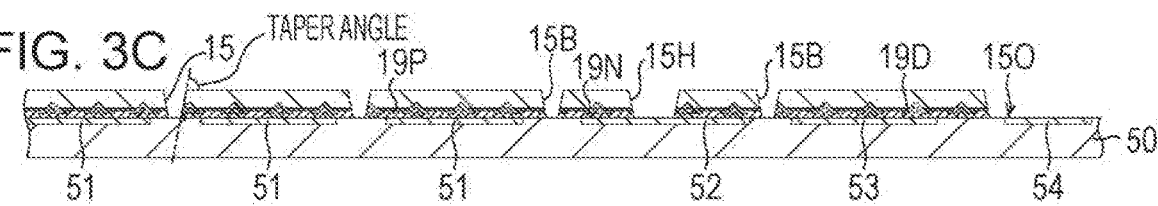

Then, as illustrated in FIG. 3C, the pixel isolation trenches 15 are formed. The pixel isolation trench 15 is a groove that is formed by etching at least layers from the nitride semiconductor layer 14 to the P-electrode layer 19, and divides the nitride semiconductor layer 14 and the P-electrode layer 19 (step 6). In the pixel region 1, the micro light emitting elements 100 are divided by the pixel isolation trenches 15. The P-electrode layer 19 the pixel region 1 corresponds to the P-electrode 19P that is connected to the P-side layer 13 of the micro light emitting element 100 (step 3). A boundary groove 15B is formed simultaneously at each boundary between the pixel region 1 and the common interconnection region 2, and between the common interconnection region 2 and the dummy region 3. The common interconnection region 2 or the dummy region 3 may further be divided into small pieces by the boundary grooves 15B. The P-electrode layer 19 in the common interconnection region 2 corresponds to the N-electrode 19N that is connected to the N-drive electrode 52, and the P-electrode layer 19 in the dummy region 3 corresponds to the dummy P-electrode 19D. In the peripheral region 4, the nitride semiconductor layer 14 and the P-electrode layer 19 are removed (exposed region 150), and the external connection electrode 54 is exposed. In the common interconnection region 2, a common electrode contact hole 15H is formed on the N-drive electrode 52.

In the sectional view of FIG. 3C, the pixel isolation trench 15 desirably has a sectional shape with forward tapered side walls that form the contours of the micro light emitting elements 100. With this shape, the pixel isolation trench 15 is easily filled in a step of forming the filling material 20 in the later process. When the pixel isolation trench 15 has reverse tapered side walls, bubbles tend to remain on the side walls, leading to variations in light output. As long as the above-mentioned problem does not arise un the step of forming the filling material 20, the pixel isolation trench 15 may have reverse tapered side walls.

When the taper angle is largely deviated from 90°, however, the area of the light emission layer 12 is reduced, and hence the taper angle is desirably in the range from 70° to 110°. Here, the above-mentioned taper angle represents an angle formed by the side wall forming the contour of the micro light emitting element 100 and the light emission surface as illustrated in FIG. 3C.

Processing in steps subsequent to this step is performed on the driving circuit substrate 50, and each patterning process is performed on the driving circuit substrate 50 with precise alignment. In this process, the step of forming the pixel isolation trench 15 and the boundary groove 15B, and the step of forming the exposed region 150 and the common electrode contact hole 15H may be separately performed.

Figure 3D:
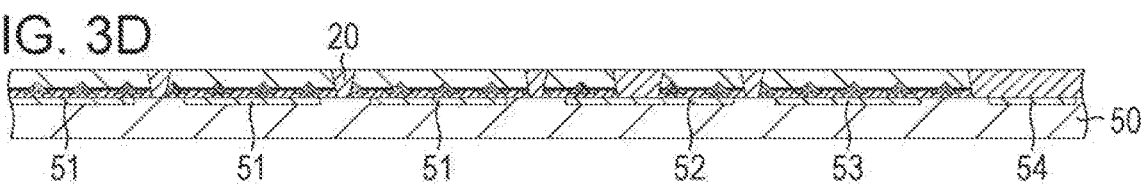

Then, as illustrated in FIG. 3D, the pixel isolation trench 15 is filled with the filling material 20, and the nitride semiconductor layer 14 is exposed. At the same time, the boundary groove 15B, the common electrode contact hole 15H, and the exposed region 150 are also filled with the filling material 20. The filling material 20 is a layer having an object of flattening the surface for common N-electrode formation in the later process. The filling material 20 may be a resin material or a CVD film, or a combination thereof. The filling material 20 may be a resin to which pigment absorbing light or carbon black is added so as to avoid light from leaking to neighboring pixels. In contrast to this, the filling material 20 may be a resin to which white pigment serving as a reflective material or a scattering particle is added so that the reflection is reinforced to improve the light output of the micro light emitting element 100. In order to keep light from leaking to the neighboring pixels, thereby reinforcing the reflection on the side walls of the pixel isolation trench 15, similarly to the slope 16A, the laminated structure of a transparent insulating film and a metal film having high reflectance may be provided to the side walls of the pixel isolation trench 15.

Figure 3E:
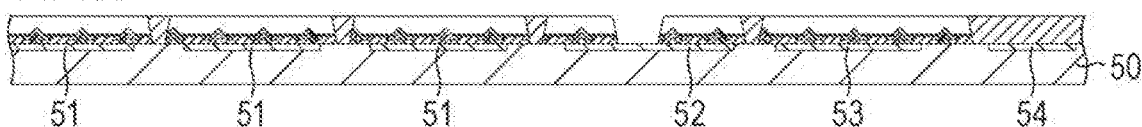
Figure 3F:
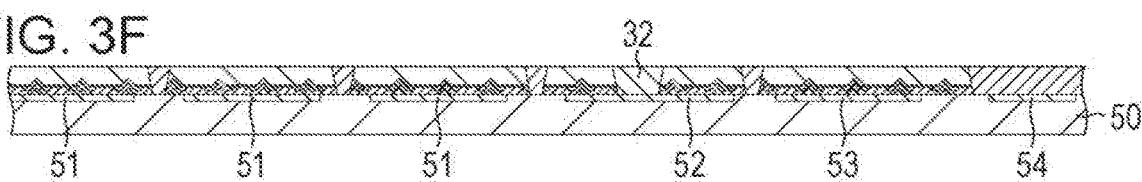
Figure 3G:
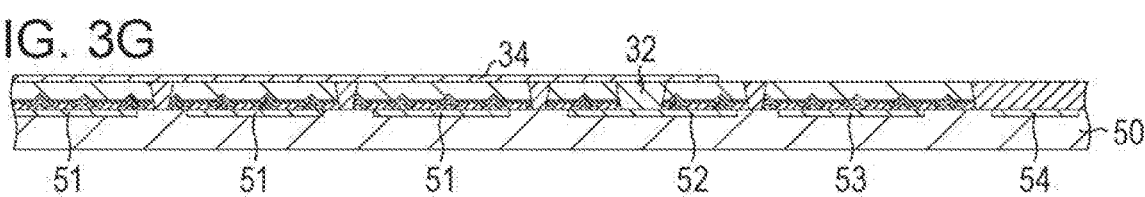
Figure 3H:
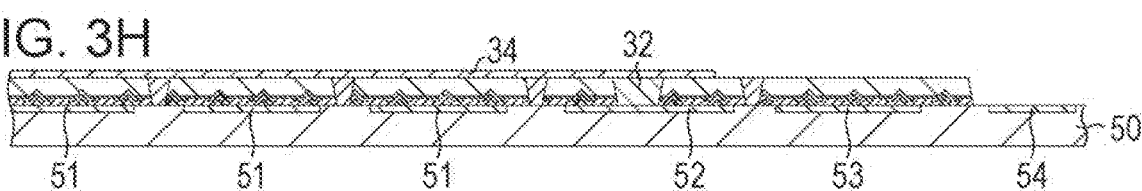

Then, as illustrated in FIG. 3E, the filling material 20 in the common electrode contact hole 15H is removed, and as illustrated in FIG. 3F, the common electrode contact hole 15H is filled with the plug 32. The plug 32 may be made of a material such as tungsten. In addition, as illustrated in FIG. 3G, the common N-electrode 34 is formed on the surface opposite to the driving circuit substrate 50 of the nitride semiconductor layer 14 (step 7). The common N-electrode 34 may be a transparent conductive film, such as ITO, or a metal mesh electrode having an opening corresponding to a large part of the nitride semiconductor layer 14 and a metal thin film pattern provided above the pixel isolation trenches 15, or a combination thereof. The common N-electrode 34 is connected to the N-side layer 11 of the micro light emitting element 100, and is connected to the N-drive electrode 52 through the plug 32 in the common interconnection region.

As described above, the method of manufacturing the image display device includes: the step (the above-mentioned step 1) of laminating, on the growth substrate 10, the N-side layer 11, the light emission layer 12, and the P-side layer 13 in this order to obtain the nitride semiconductor layer 14; the step (the above-mentioned step 2) of etching the P-side layer 13, the light emission layer 12, and a part of the N-side layer 11 of the nitride semiconductor layer 14 to form the slope 16A, thereby forming the micro-mesa 16 having the flat top surface 16T formed by the P-side layer 13, and the slope 16A; the step (the above-mentioned step 3) of providing the first electrode 19P on the P-side layer 13; the step (the above-mentioned step 4) of bonding the nitride semiconductor layer 14 to the driving circuit substrate 50; the step (the above-mentioned step 5) of removing the growth substrate 10; the step (the above-mentioned step 6) of etching the nitride semiconductor layer 14 on the driving circuit substrate 50, thereby dividing the nitride semiconductor layer 14 for each of the micro light emitting elements 100; and the step (the above-mentioned step 7) of forming the second electrode 34 on the surface opposite to the driving circuit substrate 50 of the nitride semiconductor layer 14. The step (the above-mentioned step 2) of forming the micro-mesa is performed before the bonding step (the above-mentioned step 4).

Finally, the filling material 20 in the peripheral region 4 is removed so that the external connection electrode 54 is exposed on the surface. After the common N-electrode 34 is formed, a wavelength conversion layer may be formed on the micro light emitting element 100. When the wavelength conversion layer is formed, the surface of the image display device 200 is desirably flat as illustrated in FIG. 3G. The wavelength conversion layer is formed by spin coating, and hence if the surface is not flat, non-uniformity such as striation occurs in the coating film, which may arise a problem of a non-uniform wavelength conversion layer. When the nitride semiconductor layer 14 is not present in the dummy region 3, an unevenness having a height of several micrometers, which is the thickness of the nitride semiconductor layer 14, is formed. Such a large unevenness causes a big problem. Thus, the nitride semiconductor layer 14 has to be present in the dummy region 3, and the dummy electrode 53 configured to fix the nitride semiconductor layer 14 has to be present as well.

The image display devices 200 formed on the driving circuit substrate 50 are separated through cutting at the end to be packaged.

In this manufacturing process, the nitride semiconductor layer 14 can be bonded to the driving circuit substrate 50 without precise alignment, and hence simplified equipment can be used for the bonding step and bonding can be completed in a short time, which means that quite high production efficiency can be achieved. Further, bonding can be performed at a wafer level, and hence all the steps can be performed in the semiconductor wafer process with high cleanliness. As a result, generation of dust can be avoided and high yield can be achieved. The cost of the image display device 200 can therefore be reduced.

(Performance of Micro Light Emitting Element 100)

The micro light emitting element 100 of the present embodiment was obtained by employing the following configuration in the micro light emitting element 100 illustrated in FIG. 1A to FIG. 1C.

A contour in a plan view: a square having one side with a length of 8.5 μm (the width of the pixel isolation trench 15 is 1.5 μm, and the arrangement pitch of the micro light emitting elements 100 is 10 μm)

A micro-mesa: the center of the micro-mesa is placed at each vertex of an equilateral triangle having one side of 2 μm $t_p$=100 nm
$t_{mqw}$=70 nm
$t_n$=5000 nm
$\theta$=45°
D=500 nm
$\phi$=1 μm Further, a micro light emitting element formed without the micro-mesa structure of the present embodiment was used as a comparative example.

Under a state where the same drive current was supplied to the micro light emitting element 100 of the present embodiment and the micro light emitting element of the first comparative example, the light output of each micro light emitting element was measured. As a result, the light output of the micro light emitting element 100 of the present embodiment was 190% of the light output of the micro light emitting element of the comparative example.

The inventor of the present application supposes that this great increase in light output is achieved due to the micro-mesas 16. The micro-mesa slope 16A is provided, and the outer side of the slope 16A is covered with the protective film 17 made of a transparent material having a low refractive index, with the result that horizontal light emitted from the light emission layer 12 is totally reflected toward the emission surface. Then, the reflected light substantially vertically enters the light emission surface of the N-side layer 11 to be emitted to toe outside.

When the micro-mesa slope 16A is not provided, such light is emitted from the light emission layer 12 in the horizontal direction to be absorbed by the filling material 20 or attenuated while being iteratively reflected in the nitride semiconductor layer 14. This means that such light is not emitted to the outside.

In the micro light emitting element 100, the micro-mesas 16 are formed so that the area of the light emission layer 12 is reduced as compared to the area of the micro light emitting element 100. In the present embodiment, the ratio of the area of the light emission layer 12 to the area of the micro light emitting element 100 is $\pi \cdot 600^2/(\frac{1}{2} \cdot 2000^2 \cdot \sqrt{3})$ =0.326 on average, and is about 33%. Thus, the density of current that is injected into the light emission layer 12 is increased about three times.

With the use of data on the current dependence of the external quantum efficiency, the internal quantum efficiency and the light extraction efficiency were separated from each other, and the internal quantum efficiency was evaluated. As a result, the internal quantum efficiency of the micro light emitting element 100 of the present embodiment and the internal quantum efficiency of the micro light emitting element of the first comparative example were 66% and 70%, respectively, and it was found that the formation of the micro-mesas 16 reduced the internal quantum efficiency. As a reason for this, both of the droop effect due to an increase in density of current and the effect of damage during etching in forming the micro-mesas are conceivable. It was consequently found that an improvement in light emission efficiency in the micro light emitting element 100 of the present embodiment was greatly contributed by an improvement in light extraction efficiency (2.0 times=1.9=70%/66%).

Modified Example

Figure 4A:
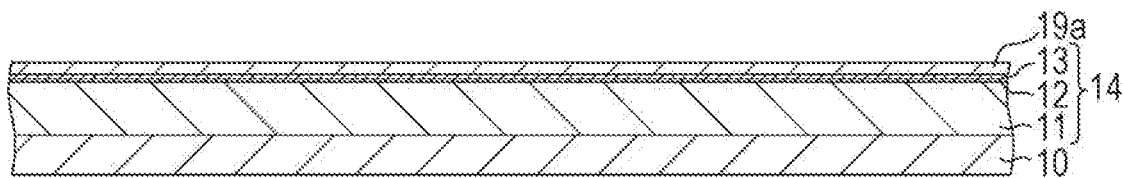
FIG. 4A to FIG. 4C are sectional views of steps of a forming process of a micro-mesa of a micro light emitting element according to a modified example of the first embodiment.
Figure 4B:
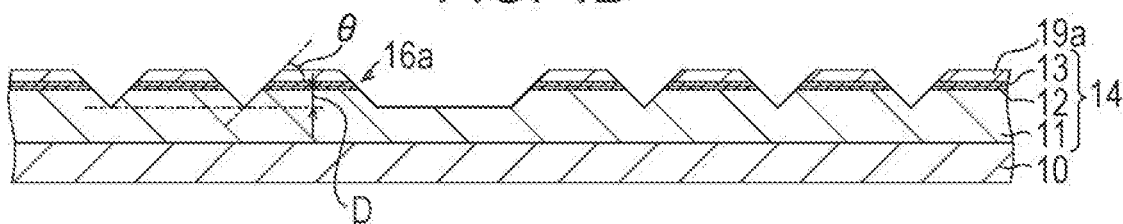
Figure 4C:
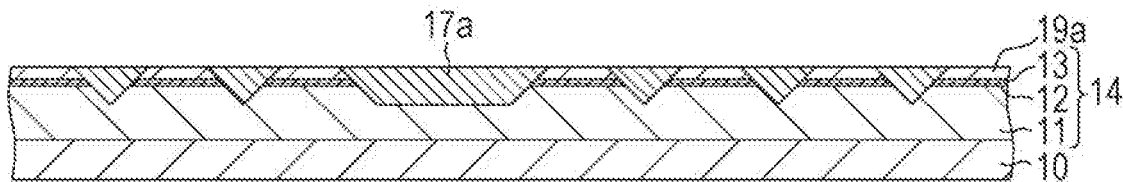

The configuration and a manufacturing method of a micro light emitting element 100a according to a modified example of the first embodiment are described with reference to FIG. 4A to FIG. 4C. FIG. 4A to FIG. 4C are sectional views of the micro light emitting element 100a in steps in the manufacturing method of: this modified example. This modified example is different from the first embodiment in that a P-electrode layer 19a is divided for each of micro-mesas 16a. The modified example is the same as the first embodiment in the remaining points.

In the micro light emitting element 100a, as illustrated in FIG. 4A, after the nitride semiconductor layer 14 illustrated in FIG. 2A is grown, the P-electrode layer 19a is formed on the surface of the nitride semiconductor layer 14. The P-electrode layer 19a may be the metal multilayer film illustrated in FIG. 2E, or may be a combination of a transparent conductive layer and a metal multilayer film, such as ITO.

Then, as illustrated in FIG. 4B, the micro-mesa 16a is formed. FIG. 4B is the same as FIG. 2B except that the P-electrode layer 19a is formed on the surface of the micro-mesa 16a. Subsequently, as illustrated in FIG. 4C, a protective film 17a is laminated, and by CMP, the surface of the protective film 17a is flattened to expose the P-electrode layer 19a. On the driving circuit substrate 50, the nitride semiconductor layer 14 illustrated in FIG. 4C is bonded. A process of forming the micro light emitting element 100a and an image display device 200a is the same as that illustrated in FIG. 3A to FIG. 3H.

In this way, the P-electrode of the micro light emitting element 100a that is divided for each of the micro-mesas 16a exhibits the same performance. Further, the process can be simplified as compared to the process in FIG. 2A to FIG. 2F.

Second Embodiment

The present embodiment is basically the same as the first embodiment except for the shape of the micro-mesa. In the first embodiment, as illustrated in FIG. 1C, the micro-mesa that is a circle in a plan view is placed at the vertex of the equilateral triangle, but the shape of the micro-mesas is not limited to a circle. As illustrated in FIG. 5A to FIG. 5E, various shapes and arrangements can be employed.

Figure 5A:
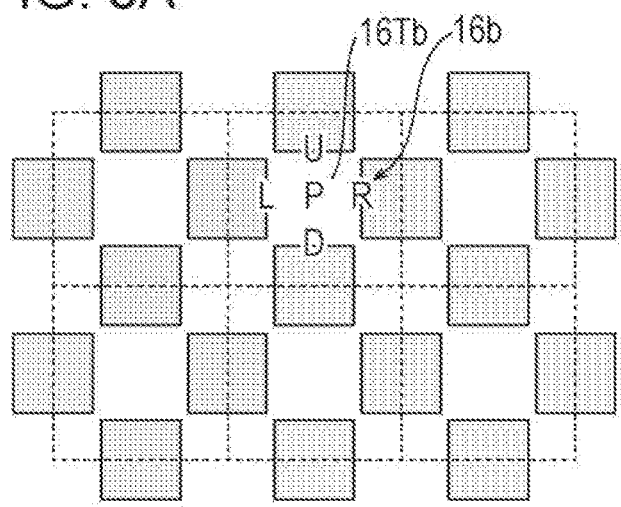
FIG. 5A, FIG. 5C, and FIG. 5E are plan views illustrating the planar shape of a micro-mesa of a micro light emitting element according to a second embodiment of the present disclosure.
Figure 5B:
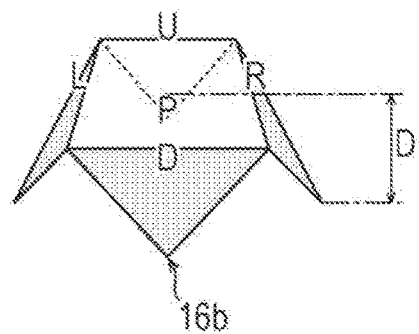
FIG. 5B and FIG. 5D are bird's-eye views illustrating slopes in FIG. 5A and FIG. 5C, respectively.
Figure 5C:
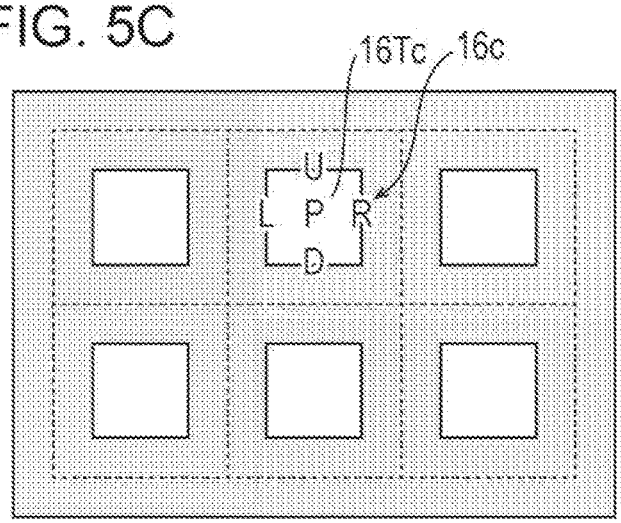
Figure 5D:
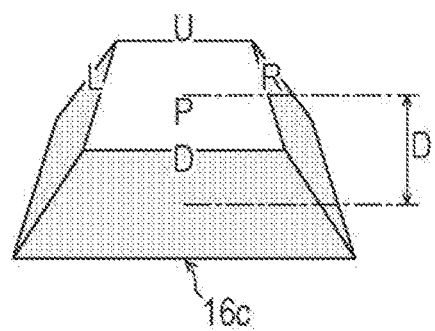
Figure 5E:
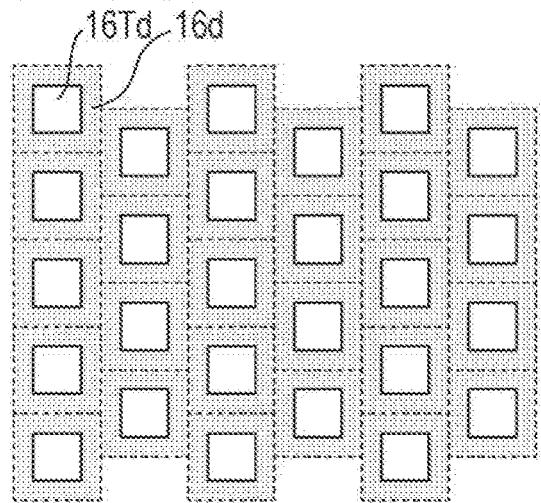

FIG. 5A, FIG. 5C, and FIG. 5E are examples of the quadrilateral shapes of the micro-mesa. FIG. 5B is a bird's-eye view of one micro-mesa in FIG. 5A when viewed from an upper side, illustrating a slope 16b. FIG. 5D is a bird's-eye view of one micro-mesa in FIG. 5C when viewed from an upper side, illustrating a slope 16c. In FIG. 5A, when the surrounding of a center P of the micro-mesa viewed from the center P, the slopes 16b do not completely cover the surrounding as illustrated in FIG. 5B. In the case of FIG. 5C, on the other hand, as illustrated in FIG. 5D, the slopes 16c cover all the sides. Thus, as compared to a case where no micro-mesa structure is provided, the light extraction efficiency is improved in either case, but the structure in FIG. 5C achieves a larger effect of improvement in light extraction efficiency. That is, an advantage of improvement in light extraction efficiency can be obtained even when the periphery of the light emission layer 12 is not entirely covered as in the case with the slope 16b, but the light emission layer 12 is more desirably covered with the slope over the entire periphery as in the case with the slope 16c.

Even when the arrangement is shifted as in 5E, the same effect of improvement in light extraction efficiency as that in FIG. 5C can be achieved.

Figure 6A:
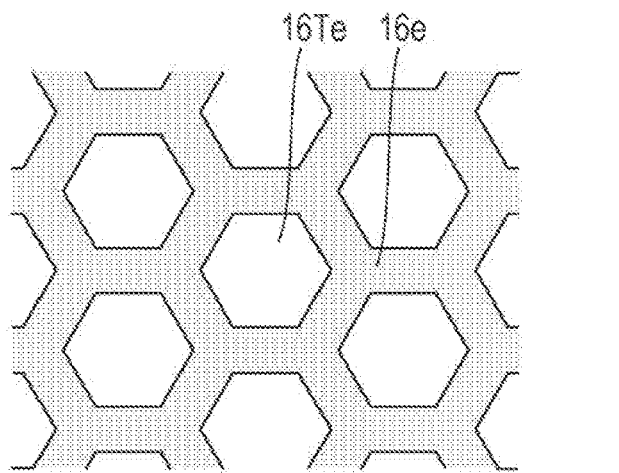
FIG. 6A to FIG. 6C are other plan views illustrating the planar shape of the micro-mesa of the micro light emitting element according to the second embodiment of the present disclosure.
Figure 6B:
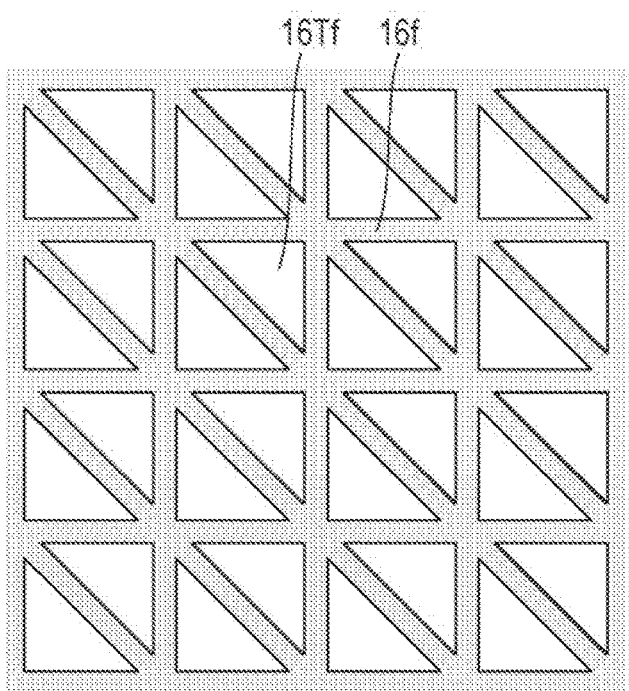
Figure 6C:
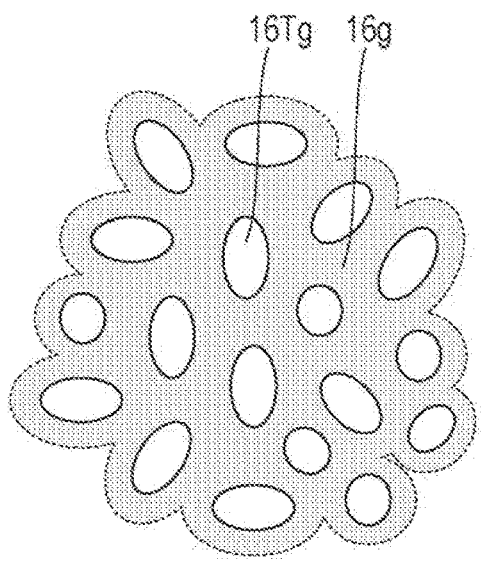

In addition, the effect of improvement in light extraction efficiency is obtained also with a hexagonal macro-mesa as illustrated in FIG. 6A or a micro-mesa having a shape of a combination of triangles as illustrated in FIG. 6B. Further, as long as the micro-mesas can be densely arranged, as illustrated in FIG. 6C, micro-mesas having locally random shapes may be arranged in a non-periodic manner.

Third Embodiment

Figure 7A:
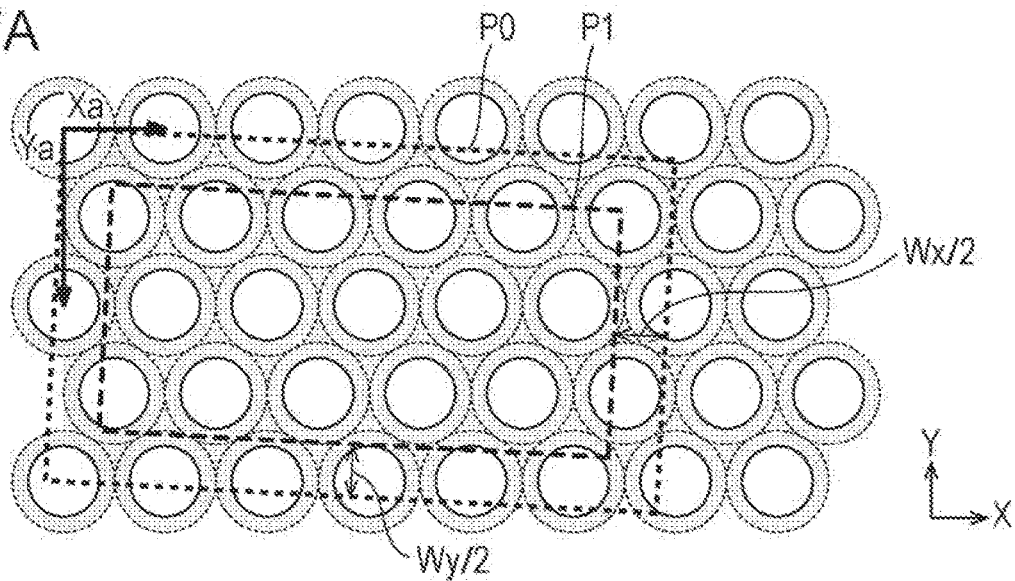
FIG. 7A to FIG. 7C are plan views illustrating a relationship between the arrangement pattern of micro light emitting elements and the arrangement pattern of micro-mesas according to a third embodiment of the present disclosure.
Figure 7B:
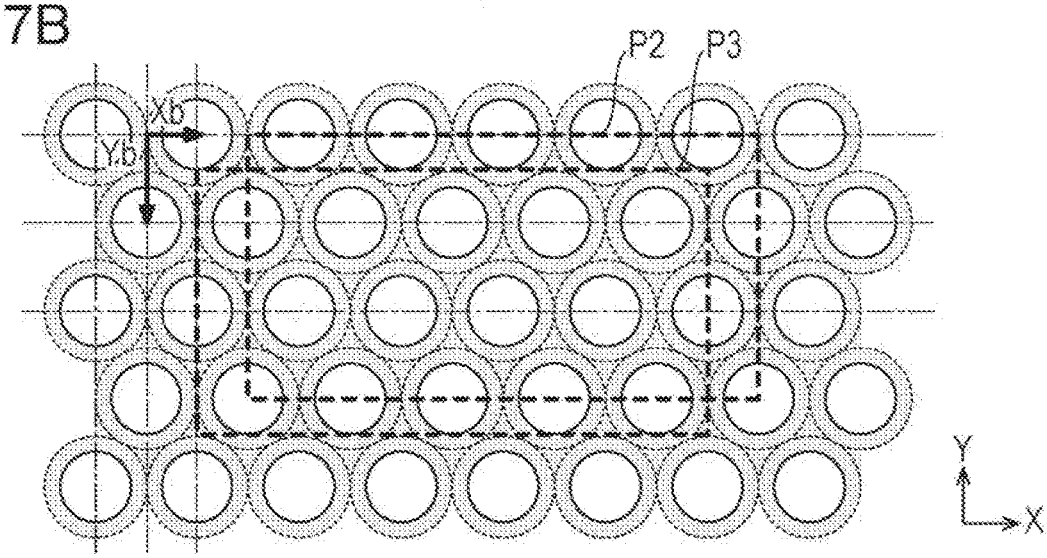
Figure 7C:
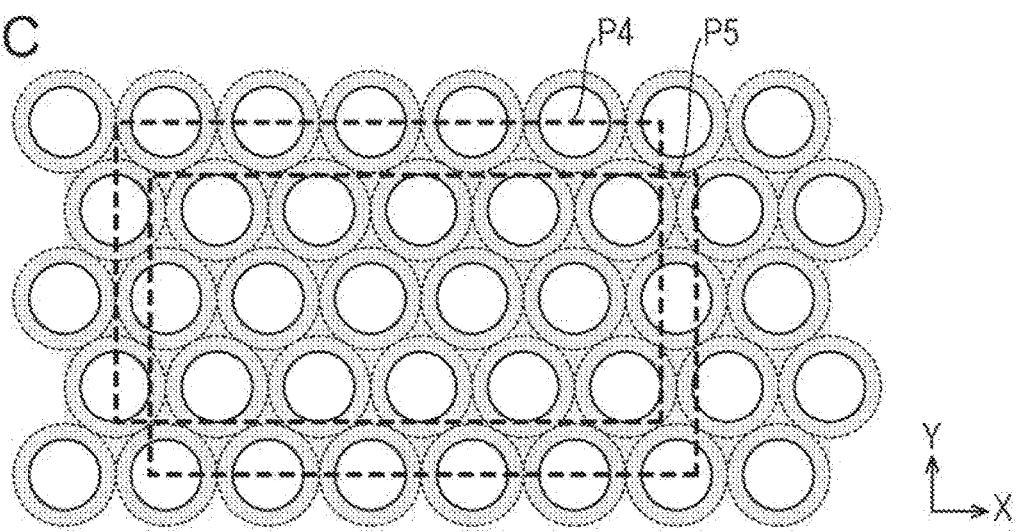

The present embodiment is the same as the first embodiment and the second embodiment except that a relationship between the arrangement pattern of the micro-mesas and the size of the micro light emitting element 100 is limited. With reference to FIG. 7A to FIG. 7C, description is given on the fact that the arrangement pattern of the micro-mesas and the size of the micro light emitting element 100 desirably satisfy a certain relationship in order to uniform the light emission performance of the micro light emitting element.

The pattern of the micro light emitting elements 100 is processed with precise alignment to the driving circuit substrate 50, but the micro-mesas formed on the nitride semiconductor layer 14 is not aligned to the driving circuit substrate 50. The shape of the micro light emitting element 100 is thus formed irrespective of the arrangement of the micro-mesas. FIG. 7A exemplifies a relationship between the micro-mesa pattern, and a rectangle P1 representing the contour of the micro light emitting element 100 and a rectangle P0 representing the center lines of the pixel isolation trenches 15 around the micro light emitting element 100. P0 and P1 are overlapped with the micro-mesa pattern without any pattern to pattern alignment. The micro-mesas included in P1 correspond to the light emission region of the micro light emitting element. P0 represents the arrangement period of the micro light emitting elements 100. As illustrated in FIG. 7A in an emphasized manner, the coordinate axis of the micro-mesa pattern and the coordinate axis of the micro light emitting element 100 may not be parallel to each other, and may be shifted at an angle. The angle at which the coordinate axes are shifted is determined by, for example, the alignment precision of a wafer notch in bonding the growth substrate 10 having the nitride semiconductor layer 14 to the driving circuit substrate 50. The angle is generally 0.5° or less, which is small. Thus, such shift does not cause a big problem in the size range of the micro light emitting element 100, and hence the coordinate axes are regarded as being parallel to each other in the figures referred to below, as in FIG. 7B. Such shift, however, causes a problem for the entire image display device 200.

In this way, in the present embodiment, when the micro light emitting element 100 is viewed from the P-side layer side in a plan view, the micro light emitting element 100 is a rectangle, and the micro-mesas are arranged in a matrix pattern parallel or substantially parallel to one side of the rectangle. Here, the term "substantially parallel" indicates a case where the micro-mesa and the side of the rectangle are shifted at a prescribed angle or less from the state of being parallel to each other, for example, a case where the micro-mesa and the side of the rectangle are shifted at 0.5° or less from the state of being parallel to each other.

Further, as illustrated in FIG. 7A, in the present embodiment, when the micro light emitting element 100 is viewed from the P-side layer side in a plan view, the micro light emitting element 100 includes a micro-mesa losing a part of its flat top surface. The same holds true in the examples illustrated in FIG. 7B and FIG. 7C.

As illustrated in FIG. 7B, the micro light emitting element 100 having the contour of P1 may be placed at a position P2 or P3. In such a case, the number of complete micro-mesas included in the micro light emitting element 100 is 9 in the case of P2 and 14 in the case of P3, which are largely different from each other. In this way, depending on the alignment, the number of micro-mesas having the complete flat top surfaces 16T is varied between the micro light emitting elements. Here, a micro-mesa also having the complete slope 16A has the highest light output, and as the size of a lost part becomes larger, the light output becomes lower. The number of micro-mesas having the complete flat top surfaces 16T is accordingly used as the criterion of the light extraction efficiency. When the pixel isolation trenches 15 are formed, the flat portions or the slope portions of some micro-mesas are divided, and hence a part of the pattern is lost. As the amount of cut by the pixel isolation trench 15 becomes larger, the amount of light emitted from the incomplete micro-mesa becomes lower. When the flat portion is cut, the amount of current is reduced, leading to a reduction in light emission amount. Even when only the slope portion is cut, the extraction efficiency drops and the amount of light extraction drops as a result. In short, a micro light emitting element including a larger number of complete micro-mesas achieves a larger light emission amount.

In order to reduce variations in number of micro-mesas having the complete flat top surfaces 16T as described above, the following two measures have to be taken. The first measure is to reduce variations in light emission amount between micro light emitting elements relatively close to each other. The second measure is to reduce the degree of variations in light emission amount between the micro light emitting elements.

In order to improve the first point, the micro light emitting elements close to each other in the image display device 200 may have the same arrangement of the micro-mesas. This may be achieved when the arrangement period of the micro light emitting elements is an integer multiple of the arrangement period of the micro-mesas. Then, in the micro light emitting elements close to each other, the micro-mesa arrangement patterns in the micro light emitting elements can be the same. In FIG. 7A, when the period of the micro-mesas in an X direction is denoted by Xa and the period of the micro-mesas in a Y direction s denoted by Ya, a length P0x of P0 in the X direction may be N×Xa (N is an integer), and a length P0y of P0 in the Y direction may be M×Ya (M is an integer).

A major factor of the variations regarding the second point is a variation between the position of the micro-mesa pattern relative to the P-drive electrode 51 on the driving circuit substrate 50 and the position of the pixel isolation trench 15. This variation is caused due to variations in alignment in bonding the growth substrate 10 having the nitride semiconductor layer 14 to the driving circuit substrate 50 or variations in alignment in patterning the pixel isolation trenches 15. In order to reduce such variations, as P2 in FIG. 7B, a size with which the number of complete micro-mesas included therein is largely varied depending on arrangement positions is desirably avoided. The size of the pattern P2 in FIG. 7B has the following feature. Specifically, when the row period of the micro-mesas in the X direction is denoted by Xb (=Xa/2), and the column period of the micro-mesas in the Y direction is denoted by Yb (=Ya/2), with respect to the periods Xb and Yb, a length P2x of P2 in the X direction is 2×L×Xb (L is an integer), and a length P2y of P2 in the Y direction is 2×K×Yb (K is an integer).

In this way, the arrangement pitch of the micro light emitting elements in a two-dimensional array is an integer multiple of the period of the arrangement pattern of the micro-mesas in the corresponding direction.

Thus, for example, as P4 in FIG. 7C, a length P4x of P4 in the X direction may be (L+½)×Xb (L is an integer), and a length P4y of P4 in the Y direction may be (K+½)×Yb (K is an integer). In other words, the length of one side of the rectangle, which represents the contour of the micro light emitting element 100, may be different by a ½ period from an integer multiple of the period of the micro-mesas in the direction of the corresponding side. Specifically, the length in the row direction of the rectangle, which represents the contour of the micro light emitting element 100, may be different by ½ from an integer multiple of the row period of the micro-mesas, and the length in the column direction of the rectangle, which represents the contour of the micro light emitting element 100, may be different by ½ from an integer multiple of the column period of the micro-mesas.

As a result of employing such an arrangement, the numbers of complete micro-mesas in P4 and P5 in FIG. 7C, P5 having the same size as P4 and being different in position from P4, are 15 and 14, and a large difference as in FIG. 7B is not found.

Figure 8A:
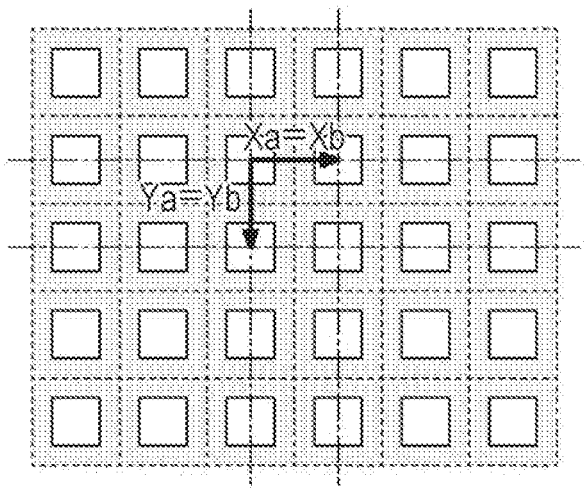
FIG. 8A and FIG. 8B are other plan views illustrating the relationship between the arrangement pattern of the micro light emitting elements and the arrangement pattern of the micro-mesas according to the third embodiment of the present disclosure.
Figure 8B:
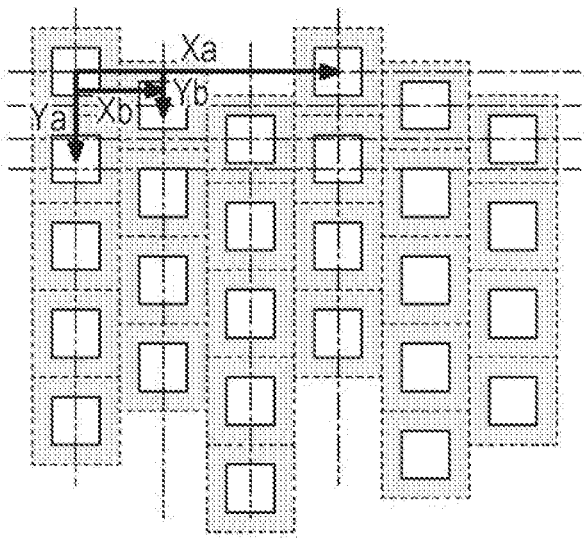

The micro-mesa pattern in FIG. 7A can be regarded as a state where two patterns having the same period are arranged to be shifted, and hence the pattern period and the pitches of the columns and the rows in the patterns are different from each other, with the result that the relationships of Xb=Xa/2 and Yb=Ya/2 are satisfied. In the case of a simple micro-mesa pattern as in FIG. 8A, however, Xb=Xa and Yb=Ya are satisfied. Even though quadrilateral micro-mesas are arranged as in FIG. 8A, in a pattern such as that in FIG. 8B, Xb=Xa/3 and Yb=Ya/3 are satisfied. A relationship between the arrangement periods (Xa and Ya) of the micro-mesa pattern and the pitches (Xb and Yb) of the columns and the rows in the micro-mesa pattern with respect to the two-dimensional array direction of the micro light emitting elements differs depending on micro-mesa patterns.

In the present embodiment, in order to improve the above-mentioned first and second points, the micro-mesa pattern and the width of the pixel isolation trench 15 are restricted to certain values. Here, Wx denotes a width of the pixel isolation trench 15 connected in the Y-axis direction, and Wy denotes a width of the pixel isolation trench 15 connected in the X-axis direction.

In the example in FIG. 7C, P0$x$=P4$x$+Wx is satisfied, and P0$x$=N×Xa and P4$x$=(L+½)×Xb are satisfied, which means that the relationship of Wx=(2×N−L−½)×Xb=(H+½)×Xb (H is an integer) is desirably satisfied. In a similar manner, P0$y$=P4$y$+Wy is satisfied, and P0$y$=M×Ya and P4$y$=(K+½)×Yb are satisfied, which means that the relationship of Wy=(2×M−K−½)×Xb=(I+½)×Yb (I is an integer) is desirably satisfied.

In the examples in FIG. 7A and FIG. 7B, when Xa=2 μm and Ya=2√3=3.464 μm are satisfied, first, Wx is desirably different from an integer multiple of 1 μm, and secondary, Wx is desirably a value shifted by 0.5 μm from the integer multiple of 1 μm. Specifically, the optimum value of Wx is 0.5 μm, 1.5 μm, or 2.5 μm, for example. At this time, P0$x$ is an integer multiple of 2 μm, and is 2 μm, 4 μm, 6 μm, 8 μm, 10 μm, or 12 μm, for example. In a similar manner, first, Wy is desirably different from an integer multiple of 1.732 μm, and secondly, Wy is desirably a value shifted by 0.866 μm from the integer multiple of 1.732 μm. Specifically, the optimum value of Wy is 0.866 μm, 2.6 μm, or 4.33 μm, for example. At this time, P0$y$ is 3.464 μm, 6.928 μm, 10.039 μm, or 13.856 μm, for example. The optimum values can be selected from the combinations as described above in consideration of the sizes of the micro light emitting elements and the processing capability of the pixel isolation trenches. In actuality, P0$x$, P0$y$, Wx, and Wy are first determined, and the shape and the arrangement of the micro-mesa patterns are designed on the basis of P0$x$, P0$y$, Wx, and Wy.

As described above, the size of the nitride semiconductor layer 14, which constructs the micro light emitting elements 100, is set to a value other than an integer multiple of the row pitch (the row period of the micro-mesas) or the column pitch (the column period of the micro-mesas) or the micro-mesa pattern, so that variations in light emission intensity between the micro light emitting elements can be reduced.

In other words, the length of one side of the rectangle, which forms the contour of the micro light emitting element 100, is set to a value other than an integer multiple of the period of the micro-mesas in the direction of the corresponding side, that variations in light emission intensity between the micro light emitting elements can be reduced.

In particular, when the size of the nitride semiconductor layer 14, which constructs the micro light emitting elements 100, is shifted by ½ from the integer multiple of the row pitch or the column pitch, variations in light emission intensity can be reduced to a minimum. Further, the arrangement period of the micro light emitting elements 100 is set to the integer multiple of the period of the micro-mesa pattern, and hence the micro light emitting elements close to each other can have uniform light emission intensities.

Fourth Embodiment

The present embodiment is the same as the first embodiment except for a method of forming the common interconnection region. The pixel region 1 is the same as the first embodiment at a point that it does not need precise alignment. The common interconnection region needs rough alignment, and a method of manufacturing an image display device 200$d$ can be simplified, which is a feature of this embodiment. The fourth embodiment is described with reference to FIG. 9A to 11H, but points different from the first embodiment are only described.

FIG. 9A is a schematic sectional view of the image display device 200$d$. FIG. 9B and FIG. 9C are a schematic sectional view and a schematic plan view illustrating micro-mesa structures in the pixel region 1 and the common interconnection region 2. FIG. 9B illustrates a section of an IXB-IXB portion in FIG. 9C.

As illustrated in FIG. 9A, a connection element 101$d$ in the common interconnection region 2 of the image display device 200$d$ is different from FIG. 1A. Specifically, the plug 32 configured to connect the common N-electrode 34 and the N-drive electrode 52 to each other is removed, and the common N-electrode 34 is connected to the N-drive electrode 52 through the N-side layer 11 and the N-electrode 19N. The N-electrode 19N is obtained by dividing the P-electrode layer 19 in the common interconnection region 2 in forming the pixel isolation trenches 15. As illustrated in FIG. 9B and FIG. 9C, in the common interconnection region 2, the micro-mesa 16 is not formed and a micro mesa vacancy 16D (hereinafter simply referred to as "vacancy") in which the N-side layer 11 is exposed is provided. That is, as compared to the micro light emitting element 100 in which the micro-mesas 16 are arranged on the entire surface, in the micro-mesa pattern of the connection element 101$d$, the vacancy 16D is provided on purpose. In the vacancy 16D, the N-electrode 19N is connected to the N-side layer 11. In the protective film 17 of the vacancy 16D, an N-side contact hole 18N is formed. The N-side contact hole 18N may be simultaneously formed with a P-side contact hole 18.

In this structure, the N-electrode 19N has to be precisely aligned to the N-drive electrode 52. The common interconnection region 2 can, however, be formed larger in size than the micro light emitting element 100, and hence the alignment is easy. When the arrangement pitch of the micro light emitting elements 100 is 10 μm, for example, in the pixel region 1 including the micro light emitting elements 100, the P-electrode 19P has to be aligned with the P-drive electrode 51 with precision of 1 μm or less. When a distance between the vacancy 16D and the pixel region is 10 μm, however, an alignment shift of at most 10 μm can be allowed under a condition that the width of the N-drive electrode 52 is 20 μm or more. With this structure, the detailed placement of the common interconnection region 2 can be designed on the basis of easily achievable alignment precision. In addition, this structure can be produced by a simpler manufacturing process as described below.

Figure 10A:
FIG. 10A to FIG. 10F are sectional views of steps of a forming process of a micro-mesa in a manufacturing process of the micro light emitting element illustrated in FIG. 9A to FIG. 9C.
Figure 10B:
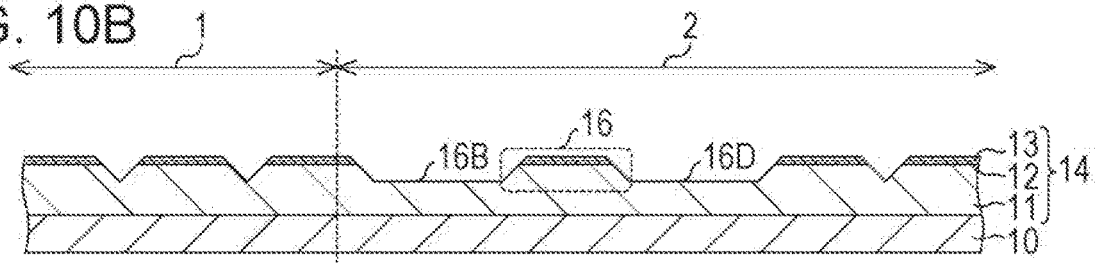

The manufacturing process of the micro-mesa structure is illustrated in FIG. 10A to FIG. 10F. FIG. 10A to FIG. 10F correspond to FIG. 2A to FIG. 2F, respectively. FIG. 10A to FIG. 10F are different from FIG. 2A to FIG. 2F in that, as illustrated in FIG. 10B, when the nitride semiconductor layer 14 is etched to form the micro-mesa, in the vacancy 16D, etching is performed to the N-side layer 11 without the formation of the flat portion and the slope portion of the micro-mesa. It is a point to note that, in the vacancy 16D, a region of the N-side layer 11 having a certain area is exposed.

Figure 10C:
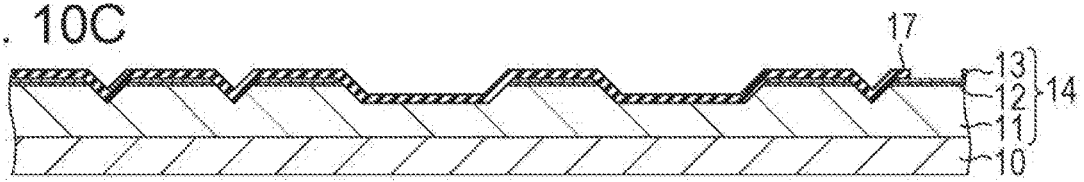
Figure 10D:
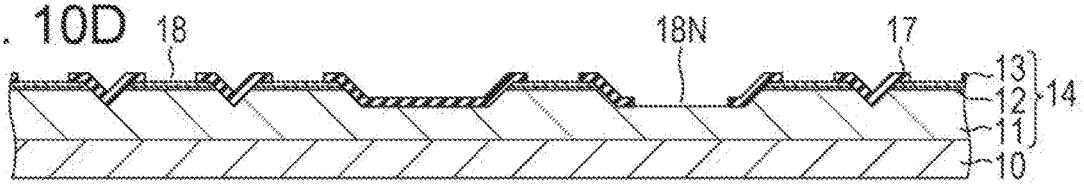
Figure 10E:
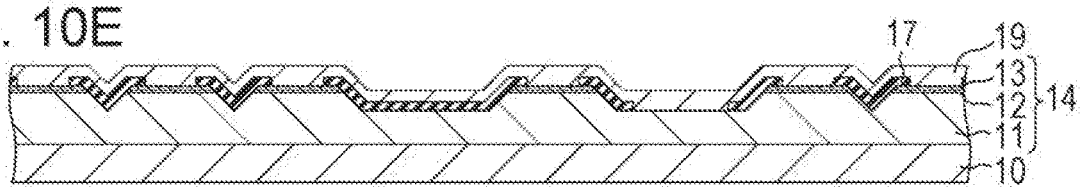
Figure 10F:
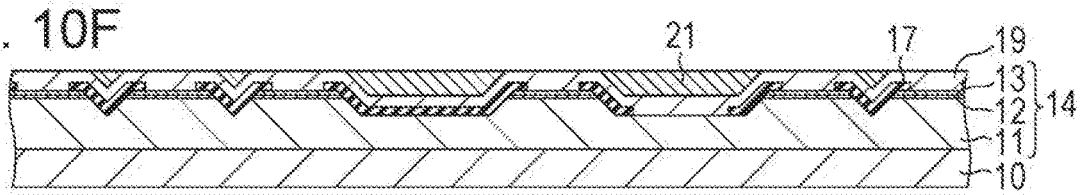
Figure 11A:
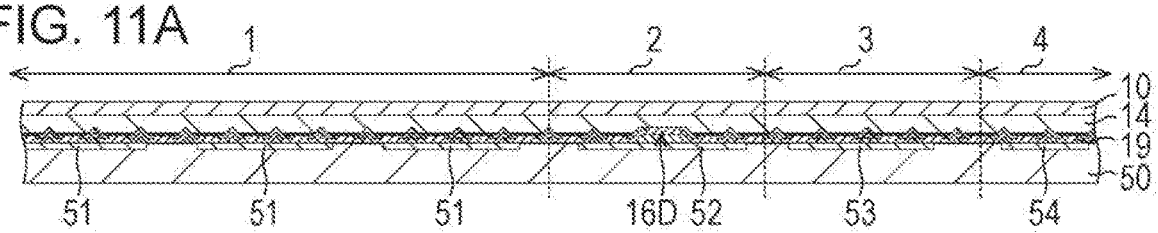
FIG. 11A to FIG. 11D, FIG. 11G, and FIG. 11H are sectional views of the micro light emitting element and the image display device in steps of a method of manufacturing the image display device illustrated in FIG. 9A to FIG. 9C.
Figure 11B:
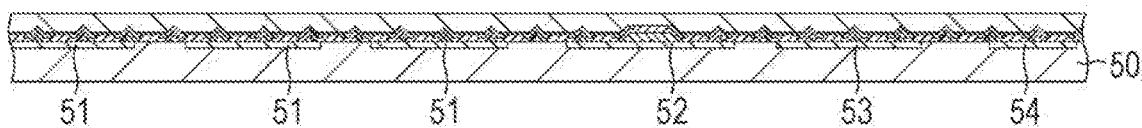
Figure 11C:
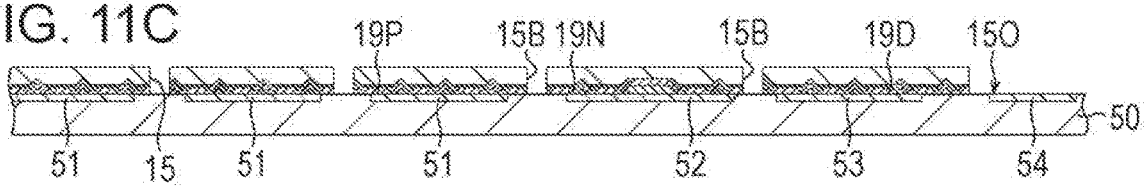
Figure 11D:
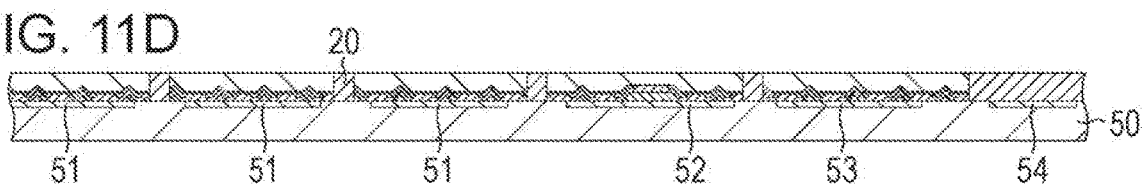
Figure 11G:
Figure 11H:
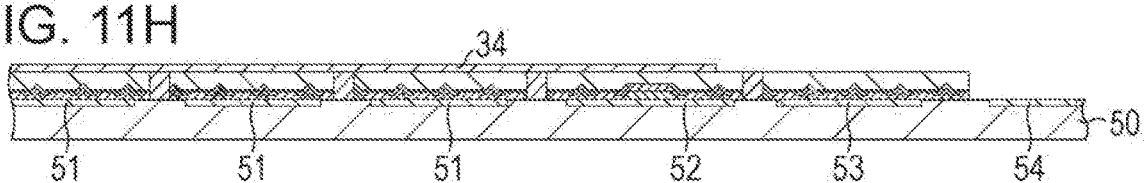

A next difference is that, in the step in FIG. 10D, in which the contact hole is formed in the protective film 17 formed in FIG. 10C, the P-side contact hole 18 is formed in the flat top surface 16T of the micro-mesa in the pixel region 1 and the N-side contact hole 18N is formed in the vacancy 16D. In FIG. 10D, the P-side contact hole 18 is also formed in the micro-mesa flat top surface 16T in the common interconnection region 2, but this P-side contact hole 18 may be omitted. The steps in FIG. 10E and FIG. 10F, which are the subsequent figures, may be the same as those in FIG. 2E and FIG. 2F.

Next, the manufacturing process of the image display device 200d is described with reference to FIG. 11A to FIG. 11D, FIG. 11G, and FIG. 11H. FIG. 11A to FIG. 11D, FIG. 11G, and FIG. 11H correspond to the respective steps denoted by the same symbols as those in FIG. 3A to FIG. 3H. A great advantage of this configuration is that the steps corresponding to FIG. 3E and FIG. 3F are omitted, and the process is thus simplified. A big difference between FIG. 11A to FIG. 11D, FIG. 11G, and FIG. 11H and FIG. 3A to FIG. 3D, FIG. 3G, and FIG. 3H is that, in bonding the nitride semiconductor layer 14 to the driving circuit substrate 50 in FIG. 11A, the growth substrate is aligned with the driving circuit substrate 50 so that the vacancy 16D is placed on the N-drive electrode 52. The subsequent steps may be the same as those in FIG. 3B to FIG. 3H except that the steps corresponding to FIG. 3E and FIG. 3F are omitted.

This configuration has no difference from the first embodiment in the pixel region 1. Thus, the performance of the micro light emitting element 100 is not changed, and high light emission efficiency can be achieved by the micro-mesa structure. In addition, the manufacturing process of the image display device 200d can be simplified.

The present disclosure is not limited to each embodiment described above, and various modifications can be made thereto within the scope of the claims. An embodiment based on a proper combination of technical measures disclosed in different embodiments is also encompassed in the technical scope of the present disclosure. In addition, a new technical feature can be derived by combining technical measures disclosed in the respective embodiments.

The present disclosure contains subject matter related to that disclosed in Japanese Priority Patent Application JP 2018-009878 filed in the Japan Patent Office on. Jan. 24, 2018, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

The invention claimed is:

1. A micro light emitting element comprising:
a nitride semiconductor layer including an N-side layer, a light emission layer, and a P-side layer laminated in this order from a side of a light emission surface;
a first electrode placed on a side of the P-side layer;
a second electrode placed on a side of the N-side layer; and
a plurality of micro-mesas formed in a surface on the side of the P-side layer of the nitride semiconductor layer, wherein:
each of the plurality of micro-mesas has a flat top surface of the P-side layer and surrounds the light emission layer by a slope, the slope being a surface extended from the P-side layer to a portion of the N-side layer, and being inclined at an angle within a prescribed range including 45° with respect to the light emission layer;
slopes of adjacent micro-mesas of the plurality of micro-mesas are at least partially touched with each other at end portions of the slopes;
the first electrode is in direct contact with the P-side layer and entirely covers a surface on the side of the P-side layer of the micro light emitting element;
the first electrode is a continuous layer that covers an entirety of the plurality of micro-mesas;
a side wall forming a contour of the micro light emitting element, the sidewall including a side surface of the nitride semiconductor layer; and
an entirety of the side surface is covered with a transparent insulating film and a metal reflective film.

2. The micro light emitting element according to claim 1, wherein the prescribed range is 45°±10°.

3. The micro light emitting element according to claim 1, wherein a vertical distance from the light emission layer to a bottom portion of the slope is equal to or less than three times a diameter of the light emission layer in a plan view.

4. The micro light emitting element according to claim 1, wherein a taper angle formed by the side wall and the light emission surface is from 70° to 110°.

5. The micro light emitting element according to claim 1, wherein when the micro light emitting element is viewed from the side of the P-side layer in a plan view, the plurality of micro-mesas are periodically arranged.

6. An image display device comprising:
a plurality of micro light emitting elements;
a driving circuit substrate having formed thereon a driver circuit configured to supply drive current to each of the plurality of micro light emitting elements, wherein:
the plurality of micro light emitting elements are laminated on the driving circuit substrate in a two-dimensional array;
each of the plurality of micro light emitting elements comprises:
a nitride semiconductor layer including an N-side layer, a light emission layer, and a P-side layer laminated in this order from a side of a light emission surface;
a first electrode placed on a side of the P-side layer;
a second electrode placed on a side of the N-side layer; and
a plurality of micro-mesas formed in a surface on the side of the P-side layer of the nitride semiconductor layer;
each of the plurality of micro-mesas has a flat top surface of the P-side layer and surrounds the light emission layer by a slope, the slope being a surface extended from the P-side layer to a portion of the N-side layer, and being inclined at an angle within a prescribed range including 45° with respect to the light emission layer;
the image display device further comprises:
a connection element that includes the nitride semiconductor layer;
the first electrode; and
the second electrode, wherein:
the connection element electrically connects the second electrode and the first electrode to each other;
the connection element further includes the plurality of micro-mesas formed in a surface on the side of the P-side layer of the nitride semiconductor layer and a micro mesa vacancy formed to expose the N-side layer on the side of the P-side layer of the nitride semiconductor layer, and electrically connecting the first electrode and the second electrode through the N-side layer; and the micro mesa vacancy, which is surrounded by the plurality of micro-mesas, is a region in which an entire convex part of the P-side layer that forms one of the plurality of micro-mesas in a cross-sectional view does not exist, the one of the plurality of micro-mesas having a same size and shape as a size and shape of each of the plurality of micro-mesas.

7. The micro light emitting element according to claim 1, wherein the slope is covered with a transparent insulating film.

8. The micro light emitting element according to claim 7, wherein the transparent insulating film covering the slope is covered with a metal film.

9. The micro light emitting element according to claim 7, wherein the transparent insulating film covering the slope is entirely covered with the first electrode.

10. The image display device according to claim 6, wherein the first electrode entirely covers a surface on the side of the P-side layer of the plurality of micro light emitting elements.

11. The image display device according to claim 6, wherein the slope is covered with a transparent insulating film.

12. The image display device according to claim 11, wherein the transparent insulating film covering the slope is entirely covered with the first electrode.

13. The image display device according to claim 6, wherein a side wall forming a contour of each of the plurality of micro light emitting elements and extending from the N-side layer to the P-side layer is covered with a transparent insulating film and a metal reflective film.

14. The micro light emitting element according to claim 1, wherein the continuous layer is made of a multilayer film.

15. A micro light emitting element comprising:
a nitride semiconductor layer including a first conductive layer, a light emission layer, and a second conductive layer with a conductive type opposite to a conductive type of the first conductive layer laminated in this order from a side of a light emission surface;
a first electrode placed on a side of the second conductive layer;
a second electrode connected to the first conductive layer; and
a plurality of micro-mesas formed in a surface on the side of the second conductive layer of the nitride semiconductor layer, wherein:
each of the plurality of micro-mesas has a flat top surface of the second conductive layer and surrounds the light emission layer by a slope, the slope being a surface extended from the second conductive layer to a part of the first conductive layer, and being inclined at an angle within a prescribed range including 45° with respect to the light emission layer, wherein
the first electrode is in direct contact with the second conductive layer and entirely covers the plurality of micro-mesas;
the first electrode is a continuous layer that covers an entirety of the plurality of micro-mesas;
a side wall forming a contour of the micro light emitting element, the side wall including a side surface of the nitride semiconductor layer; and
an entirety of the side surface is covered with a transparent insulating film and a metal reflective film.

16. The micro light emitting element according to claim 15, wherein the slope is covered with a transparent insulating film.

17. The micro light emitting element according to claim 16, wherein the transparent insulating film covering the slope is entirely covered with the first electrode.

18. The micro light emitting element according to claim 1, wherein the continuous layer is a multilayer film including a metal reflection layer on the P-side layer side.

19. The micro light emitting element according to claim 15, wherein the continuous layer is a multilayer film including a metal reflection layer on the second conductive layer side.

* * * * *